US011002803B2

(12) United States Patent
Takano et al.

(10) Patent No.: US 11,002,803 B2
(45) Date of Patent: May 11, 2021

(54) MAGNETIC FIELD DETECTION DEVICE

(71) Applicant: TDK CORPORATION, Tokyo (JP)

(72) Inventors: Kenichi Takano, Tokyo (JP); Hiraku Hirabayashi, Tokyo (JP); Yuta Saito, Tokyo (JP)

(73) Assignee: TDK CORPORATION, Tokyo (JP)

( * ) Notice: Subject to any disclaimer, the term of this patent is extended or adjusted under 35 U.S.C. 154(b) by 189 days.

(21) Appl. No.: 16/414,870

(22) Filed: May 17, 2019

(65) Prior Publication Data

US 2019/0377032 A1    Dec. 12, 2019

(30) Foreign Application Priority Data

Jun. 8, 2018 (JP) .............................. JP2018-110081

(51) Int. Cl.
*G01R 33/09* (2006.01)
*G01R 33/00* (2006.01)

(52) U.S. Cl.
CPC ......... *G01R 33/0005* (2013.01); *G01R 33/09* (2013.01)

(58) Field of Classification Search
None
See application file for complete search history.

(56) References Cited

U.S. PATENT DOCUMENTS

| 5,521,501 | A * | 5/1996 | Dettmann | ............... | G01R 33/09 |
| | | | | | 324/207.12 |
| 6,500,570 | B2 * | 12/2002 | Hasegawa | ............... | B82Y 10/00 |
| | | | | | 148/108 |
| 7,248,045 | B2 * | 7/2007 | Shoji | ............... | B82Y 25/00 |
| | | | | | 324/252 |
| 7,737,678 | B2 | 6/2010 | Shoji | | |
| 10,295,578 | B2 | 5/2019 | Higashi et al. | | |
| 2006/0002031 | A1 * | 1/2006 | Shoji | ............... | G11B 5/127 |
| | | | | | 360/313 |
| 2020/0348375 | A1 * | 11/2020 | Saito | ............... | G01R 33/09 |

FOREIGN PATENT DOCUMENTS

| EP | 2302406 A1 * | 3/2011 | ........... G01R 33/093 |
| JP | 2007-218700 A | 8/2007 | |
| JP | 2015-95630 A | 5/2015 | |
| JP | 2016-001118 A | 1/2016 | |
| JP | 2016-090440 A | 5/2016 | |
| JP | 2016-223894 A | 12/2016 | |

\* cited by examiner

*Primary Examiner* — Jermele M Hollington
(74) *Attorney, Agent, or Firm* — Oliff PLC

(57) ABSTRACT

A magnetic field detection device of an embodiment of the disclosure includes: a first magnetic field detection element having a first resistance value increasing upon application of a first magnetic field in a first direction and decreasing upon application of a second magnetic field in a second direction; and a second magnetic field detection element having a second resistance value decreasing upon application of the first magnetic field and increasing upon application of the second magnetic field. The first and second magnetic field detection elements each include first and second magneto-resistive effect films coupled in series. The first magneto-resistive effect film has a first major-axis direction inclined at a first inclination angle relative to the first direction. The second magneto-resistive effect film has a second major-axis direction inclined at a second inclination angle relative to the first direction. The magnetic field detection device satisfies conditional expressions (1) and (2).

7 Claims, 17 Drawing Sheets

MAGNETIC FIELD DETECTION DEVICE

CROSS REFERENCE TO RELATED APPLICATIONS

This application claims the benefit of Japanese Priority Patent Application No. 2018-110081 filed on Jun. 8, 2018, the entire contents of which are incorporated herein by reference.

BACKGROUND

The disclosure relates to a magnetic field detection device provided with a magnetic field detection element.

Up to now, there have been proposed several magnetic field detection devices each using a magneto-resistive effect element. For example, Japanese Unexamined Patent Application Publication No. 2016-1118 discloses a magnetic field detection device in which a direction of a centerline of a conductor along a current-flowing direction is different from a direction of a centerline of a magneto-resistive effect element along a longitudinal direction.

SUMMARY

A magnetic field detection device according to one embodiment of the disclosure includes: a first magnetic field detection element having a first resistance value that increases upon application of a first magnetic field in a first direction and decreases upon application of a second magnetic field in a second direction opposite to the first direction; and a second magnetic field detection element having a second resistance value that decreases upon the application of the first magnetic field and increases upon the application of the second magnetic field. The first magnetic field detection element and the second magnetic field detection element each include a first magneto-resistive effect film and a second magneto-resistive effect film that are coupled in series. The first magneto-resistive effect film has a first major-axis direction inclined at a first inclination angle relative to the first direction. The second magneto-resistive effect film has a second major-axis direction inclined at a second inclination angle relative to the first direction. Further, the following conditional expressions (1) and (2) are satisfied:

$$0° < θ1 < 90° \quad (1)$$

$$-90° < θ2 < 0° \quad (2)$$

where θ1 denotes the first inclination angle relative to the first direction, and θ2 denotes the second inclination angle relative to the first direction.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
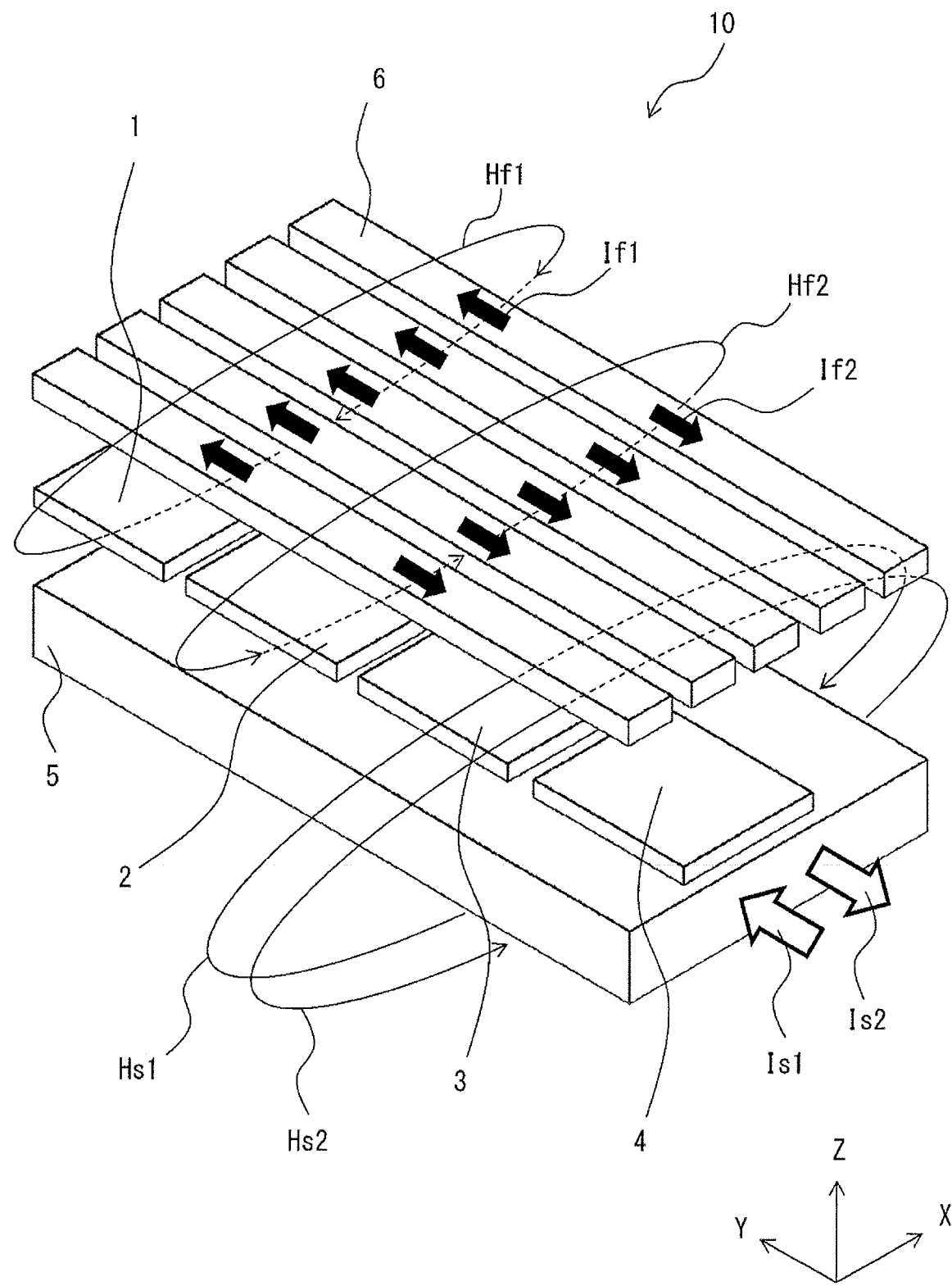
FIG. 1 is a perspective view of an overall configuration example of a magnetic field detection device according to one embodiment of the disclosure.

Some embodiments of the disclosure are described below in detail with reference to the accompanying drawings.

Incidentally, a magnetic field detection device has been requested to have further improved detection accuracy.

It is desirable to provide a magnetic field detection device that makes it possible to exhibit high detection accuracy.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. Example Embodiment

An example of a magnetic field detection device including a bridge circuit that includes four magnetic field detection elements.

2. Modification Examples

[1. Example Embodiment]
[Configuration of Magnetic Field Detection Device 10]

Figure 2A:
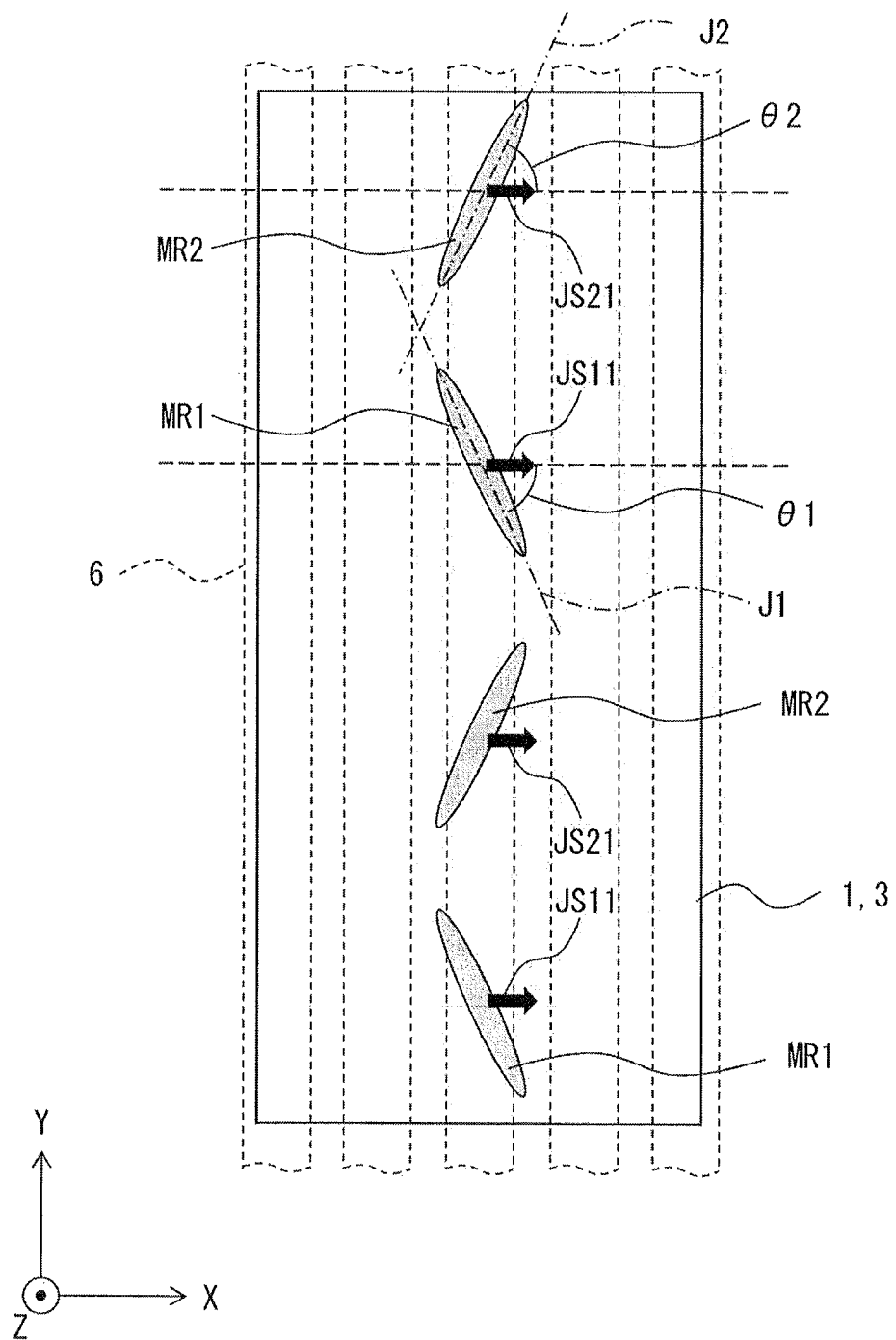
FIG. 2A is a plan view of a planar configuration of a main part of the magnetic field detection device illustrated in FIG. 1.
Figure 2B:
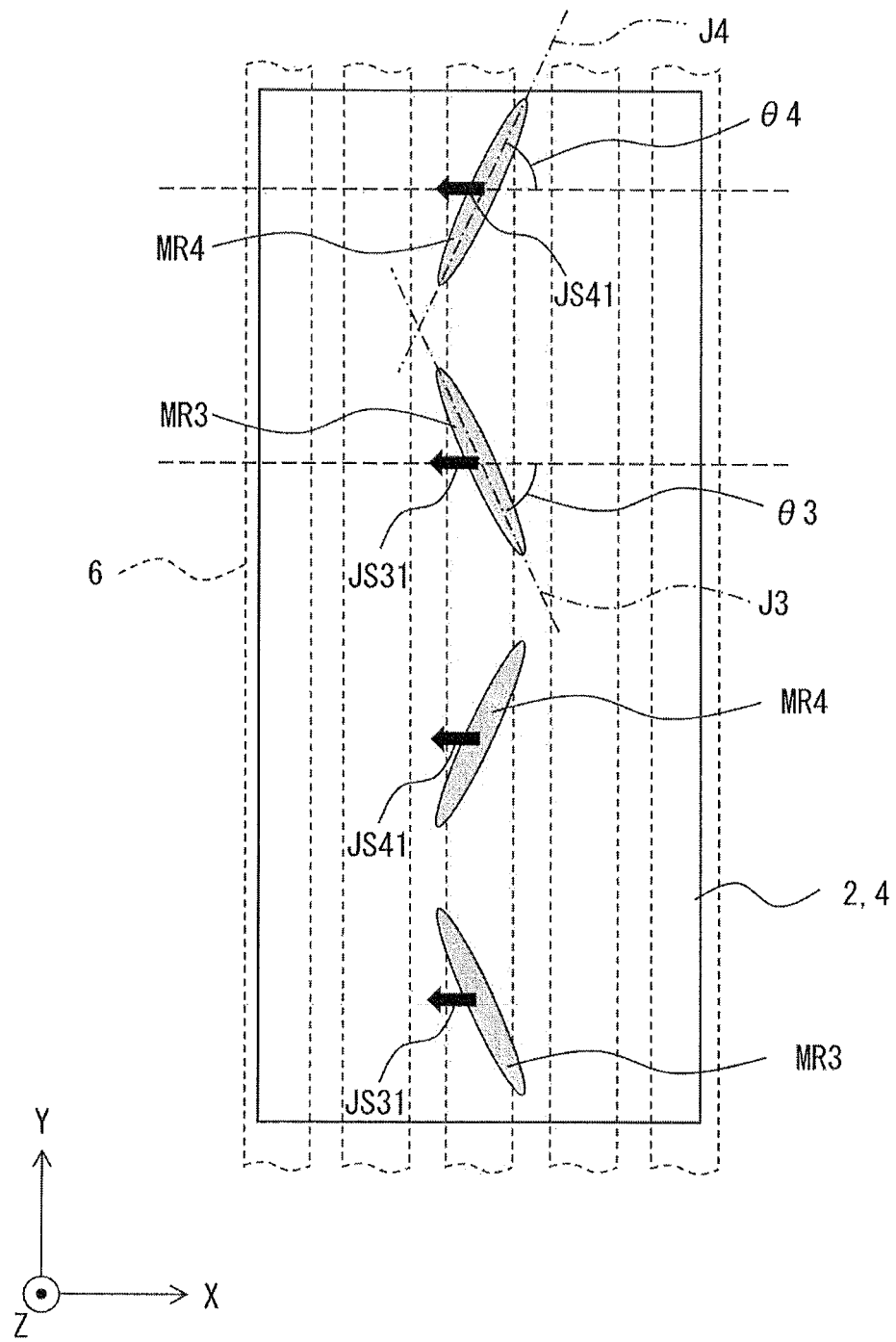
FIG. 2B is a plan view of another planar configuration of the main part of the magnetic field detection device illustrated in FIG. 1.
Figure 3A:
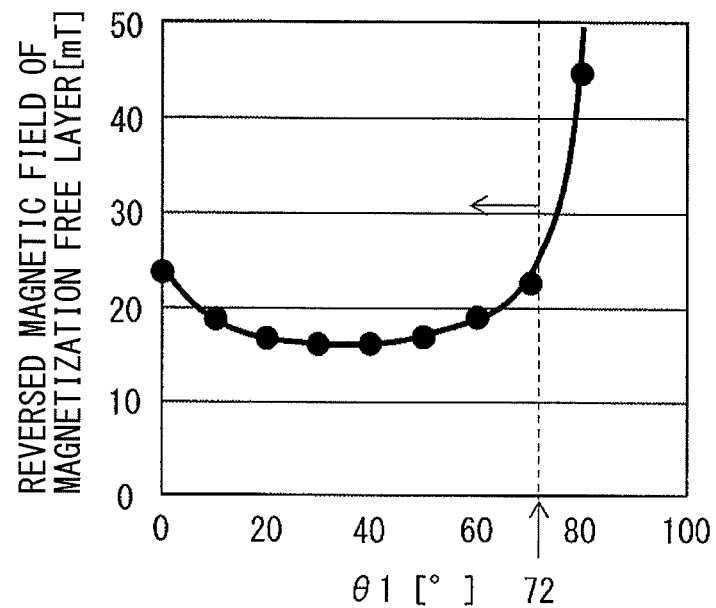
FIG. 3A is a characteristic diagram illustrating a relation between a reversed magnetic field of a magnetization free layer of a magneto-resistive effect film illustrated in FIGS. 2A and 2B and an inclination angle of the magneto-resistive effect film.
Figure 3B:
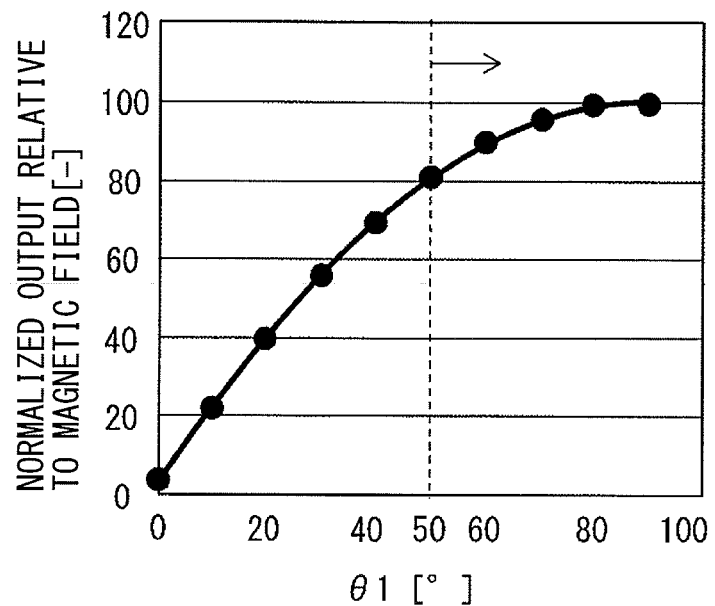
FIG. 3B is a characteristic diagram illustrating a relation between a normalized output relative to a signal magnetic field in the magneto-resistive effect film illustrated in FIGS. 2A and 2B and the inclination angle of the magneto-resistive effect film.
Figure 4:
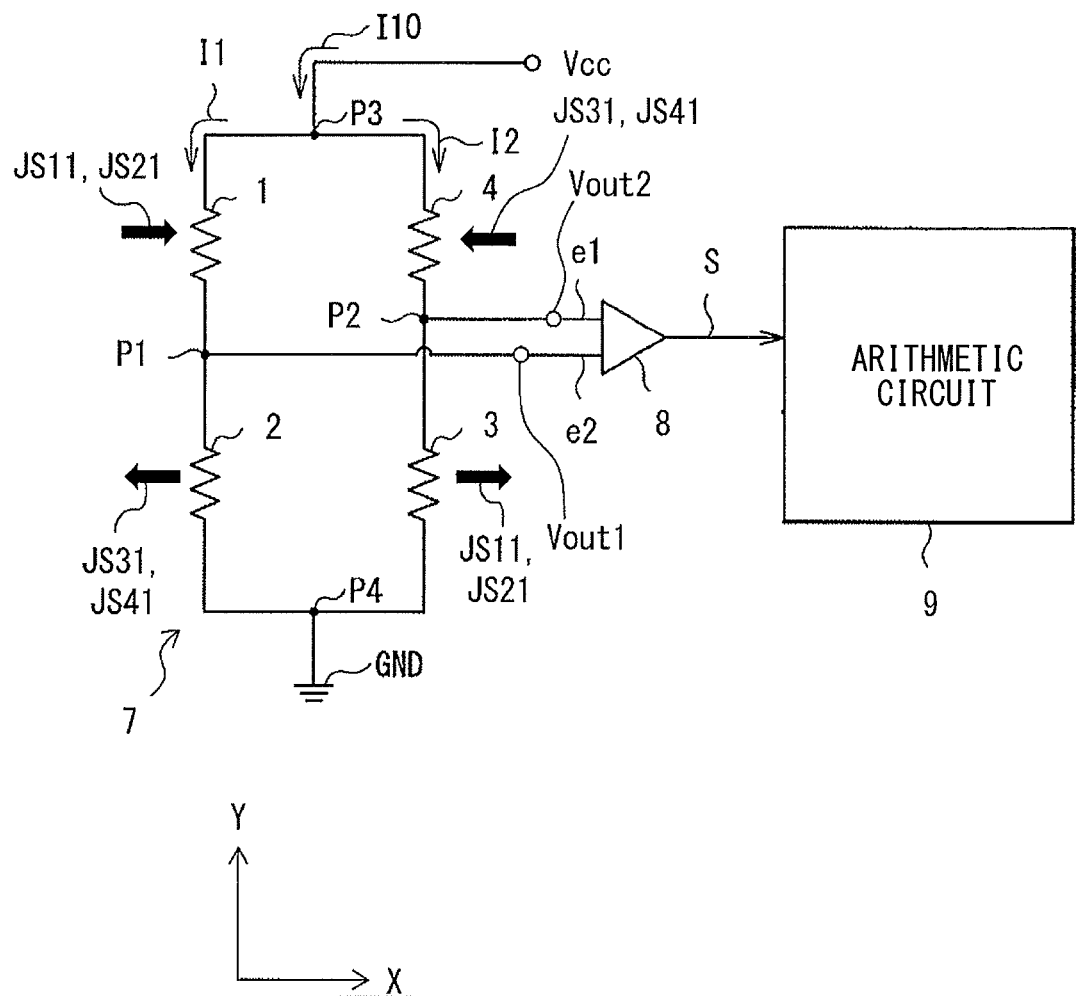
FIG. 4 is a circuit diagram of the magnetic field detection device illustrated in FIG. 1.

First, description is given, with reference to FIGS. 1 to 4, of a configuration of a magnetic field detection device 10 according to one example embodiment of the disclosure. FIG. 1 is a perspective view of an overall configuration example of the magnetic field detection device 10. FIGS. 2A and 2B are each a schematic plan view of a planar configuration of a main part of the magnetic field detection device 10. FIG. 3A is a characteristic diagram illustrating a relation between a reversed magnetic field in a ±Y direction of a magnetization free layer of a magneto-resistive effect film illustrated in FIGS. 2A and 2B and an inclination angle of the magneto-resistive effect film. FIG. 3B is a characteristic diagram illustrating a relation between a normalized output relative to a signal magnetic field in the magneto-resistive effect film illustrated in FIGS. 2A and 2B and the inclination angle of the magneto-resistive effect film. FIG. 4 is a circuit diagram illustrating a circuit configuration of the magnetic field detection device 10. The magnetic field detection device 10 may be used as a current sensor that detects, with high accuracy, a value of a current flowing inside various electronic apparatuses, for example.

The magnetic field detection device 10 may include a bus 5 stacked in order in a Z-axis direction, magnetic field detection elements 1 to 4, and a plurality of feedback wiring lines 6. The magnetic field detection element 1 and the magnetic field detection element 3 are each a specific but non-limiting example corresponding to a "first magnetic field detection element" in one embodiment of the disclosure. The magnetic field detection element 2 and the magnetic field detection element 4 are each a specific but non-limiting example corresponding to a "second magnetic field detection element" in one embodiment of the disclosure.

[Bus 5]

The bus 5 may be a conductor extending in a Y-axis direction, for example, and may be supplied with a signal current Is to be detected by the magnetic field detection device 10. A main constituent material of the bus 5 may be, for example, a high electrically-conductive material such as copper (Cu). It may also be possible to use, as the constituent material of the bus 5, an alloy containing iron (Fe) or nickel (Ni), or stainless steel. A signal current Is1 may flow in a +Y direction, for example, inside the bus 5 to thereby enable generation of a signal magnetic field Hs1 around the bus 5. Further, a signal current Is2 may flow in a −Y direction inside the bus 5 to thereby enable generation of a signal magnetic field Hs2 around the bus 5. The signal magnetic field Hs1 may be applied to the magnetic field detection elements 1 to 4 in a +X direction. Meanwhile, the signal magnetic field Hs2 may be applied to the magnetic field detection elements 1 to 4 in a −X direction.

The bus 5 is a specific but non-limiting example corresponding to a "first Conductor" in one embodiment of the disclosure. The +Y direction is a specific but non-limiting example corresponding to a "first current direction" in one embodiment of the disclosure. The signal current Is1 is a specific but non-limiting example corresponding to a "first signal current" in one embodiment of the disclosure. The signal magnetic field Hs1 is a specific but non-limiting example corresponding to a "first magnetic field" in one embodiment of the disclosure. The −Y direction is a specific but non-limiting example corresponding to a "second current direction" in one embodiment of the disclosure. The signal current Is2 is a specific but non-limiting example corresponding to a "second signal current" in one embodiment of the disclosure. The signal magnetic field Hs2 is a specific but non-limiting example corresponding to a "second magnetic field" in one embodiment of the disclosure. Directions in which the signal current Is1 and the signal current Is2 flow are orthogonal to directions in which the signal magnetic field Hs1 and the signal magnetic field Hs2 are applied to the magnetic field detection elements 1 to 4.

[Feedback Wiring Line 6]

The plurality of feedback wiring lines 6 may be disposed to face each of the magnetic field detection elements 1 to 4 while being electrically insulated from each of the magnetic field detection elements 1 to 4. The plurality of feedback wiring lines 6 may extend in the Y-axis direction along the bus 5. Similarly to the bus 5, a main constituent material of the feedback wiring line 6 may be, for example, a high electrically-conductive material such as copper (Cu). A feedback current If1 may flow in the +Y direction, for example, inside the feedback wiring lines 6 to thereby enable generation of a feedback magnetic field Hf1 around the feedback wiring lines 6. Further, a feedback current If2 may flow in the −Y direction inside the feedback wiring lines 6 to thereby enable generation of a feedback magnetic field Hf2 around the feedback wiring lines 6. The feedback magnetic field Hf1 may be applied to the magnetic field detection elements 1 to 4 in the −X direction. Meanwhile, the feedback magnetic field Hf2 may be applied to the magnetic field detection elements 1 to 4 in the +X direction. That is, the feedback magnetic field Hf1 may be applied in a direction opposite to the signal magnetic field Hs1 as viewed from the magnetic field detection elements 1 to 4, and the feedback magnetic field Hf2 may be applied in a direction opposite to the signal magnetic field Hs2 as viewed from the magnetic field detection elements 1 to 4. Although the present example embodiment exemplifies five feedback wiring lines 6 that are arranged in an X-axis direction, the number of the feedback wiring lines 6 is not limited thereto; only one feedback wiring line may be adopted.

The feedback wiring line 6 is a specific but non-limiting example corresponding to a "second conductor" in one embodiment of the disclosure. The feedback current If1 is a specific but non-limiting example corresponding to a "first feedback current" in one embodiment of the disclosure. The feedback current If2 is a specific but non-limiting example corresponding to a "second feedback current" in one embodiment of the disclosure. The feedback magnetic field Hf1 is a specific but non-limiting example corresponding to a "first feedback magnetic field" in one embodiment of the disclosure. The feedback magnetic field Hf2 is a specific but non-limiting example corresponding to a "second feedback magnetic field" in one embodiment of the disclosure.

[Magnetic Field Detection Elements 1 to 4]

The magnetic field detection elements 1 and 3 as the first magnetic field detection element each have a resistance value that increases upon application of the signal magnetic field Hs1 in the +X direction and decreases upon application of the signal magnetic field Hs2 in the −X direction. Meanwhile, the magnetic field detection elements 2 and 4 as the second magnetic field detection element each have a resistance value that decreases upon application of the signal magnetic field Hs1 in the +X direction and increases upon application of the signal magnetic field Hs2 in the −X direction.

As illustrated in FIG. 2A, the magnetic field detection elements 1 and 3 each include one or more magneto-resistive effect films MR1 and one or more magneto-resistive effect films MR2. The one or more magneto-resistive effect films MR1 and the one or more magneto-resistive effect films MR2 are coupled in series. The one or more magneto-resistive effect films MR1 each have a major-axis direction J1 inclined at an inclination angle θ1 relative to the +X direction. The one or more magneto-resistive effect films MR2 each have a major-axis direction J2 inclined at an inclination angle θ2 relative to the +X direction. Although FIG. 2A exemplifies two magneto-resistive effect films MR1 and two magneto-resistive effect films MR2 arranged alternately along the Y-axis direction in the magnetic field detection elements 1 and 3, the disclosure is not limited thereto. That is, the magnetic field detection elements 1 and 3 may be each provided with one magneto-resistive effect film MR1 and one magneto-resistive effect film MR2, or may be each provided with three or more magneto-resistive effect films MR1 and three or more magneto-resistive effect films MR2. Further, for example, the number of the magneto-resistive effect films MR1 included in the magnetic field detection element 1 and the number of the magneto-resistive effect films MR2 included therein may be equal to or different from each other; provided that a difference between the number of the magneto-resistive effect films MR1 and the number of the magneto-resistive effect films MR2 may be within 20% or lower. In the magnetic field detection element 1, the sum of the number of the magneto-resistive effect films MR1 and the number of the magneto-resistive effect films MR2 may be an even number or an odd number. Accordingly, in the magnetic field detection element 1, for example, the number of the magneto-resistive effect films MR1 may be eight, while the number of the magneto-resistive effect films MR2 may be ten. In an alternative embodiment, the number of the magneto-resistive effect films MR1 may be nine, while the number of the magneto-resistive effect films MR2 may be eight. The similar to the magnetic field detection element 1 holds true also for the magnetic field detection element 3.

The magneto-resistive effect film MR1 is a specific but non-limiting example corresponding to a "first magneto-resistive effect film" in one embodiment of the disclosure. The magneto-resistive effect film MR2 is a specific but non-limiting example corresponding to a "second magneto-resistive effect film" in one embodiment of the disclosure.

Moreover, the magneto-resistive effect film MR1 and the magneto-resistive effect film MR2 in each of the magnetic field detection elements 1 and 3 satisfy the following conditional expressions (1) and (2):

$$0° < θ1 < 90° \quad (1)$$

$$-90° < θ2 < 0° \quad (2)$$

where θ1 denotes an inclination angle of the major-axis direction J1 relative to the +X direction, and θ2 denotes an inclination angle of the major-axis direction J2 relative to the +X direction In the conditional expressions (1) and (2), the +X direction is set to 0°; an angle range clockwise from the +X direction toward the −X direction is represented by a positive numerical value, whereas an angle range counterclockwise from the +X direction toward the −X direction is represented by a negative numerical value.

In an example embodiment, the magneto-resistive effect film MR1 and the magneto-resistive effect film MR2 in each of the magnetic field detection elements 1 and 3 may further satisfy the following conditional expressions (3) and (4):

$$50° < θ1 < 72° \quad (3)$$

$$-72° < θ2 < -50° \quad (4).$$

In the conditional expressions (3) and (4) as well, the +X direction is set to 0°; an angle range clockwise from the +X direction toward the −X direction is represented by a positive numerical value, whereas an angle range counterclockwise from the +X direction toward the −X direction is represented by a negative numerical value.

Satisfying θ1<72° in the conditional expression (3) or satisfying −72°<θ2 in the conditional expression (4) makes it possible to reverse a magnetization JS13, for example, described later of a magnetization free layer S13, for example, described later in a ±Y direction, using a relatively small reversed magnetic field equal to or less than 30 mT, for example, as illustrated in FIG. 3A. Accordingly, it is possible to reduce the signal currents Is1 and Is2, which is preferable. FIG. 3A is a characteristic diagram illustrating a relation between the inclination angle θ1 [°] indicated by a horizontal axis and the reversed magnetic field [mT] indicated by a vertical axis. The reversed magnetic field [mT] refers to a magnetic field where reversal of the magnetization JS13 of the magnetization free layer S13 occurs. The characteristic diagrams of FIGS. 3A and 3B each illustrate an example of a magneto-resistive effect film MR with an elliptical planar shape having a dimension in a major-axis direction of 5 μm and a dimension in a minor-axis direction of 0.6 μm. In this example, a state of the major axis being parallel to the X-axis is represented by an equation of the inclination angle $\theta 1=0°$. The planar shape of the magneto-resistive effect film MR is not limited to an ellipse; a rectangle, a rhombus, or a shape in which a rectangle and a rhombus are superposed on each other may be adopted. In an example embodiment, a ratio between the minor axis and the major axis, i.e., an aspect ratio having an influence on the reversed magnetic field may be in a range from 4 to 20. One reason for this is that magnetism hysteresis may occur to an external magnetic field, i.e., the signal magnetic field Hs1 and the signal magnetic field Hs2 in the X-axis direction when the aspect ratio is less than 4. Another reason for this is that a reversed magnetic field necessary for the reversal of the magnetization JS13, for example, of the magnetization free layer S13, for example, may exceed 30 mT when the aspect ratio exceeds 20.

Moreover, satisfying $50°<\theta 1$ in the conditional expression (3) or satisfying $\theta 2<-50°$ in the conditional expression (4) makes it possible, for example, to suppress output decline within 20% or lower as well as suppress an output variation, as illustrated in FIG. 3B. This makes it possible to maintain favorable sensitivity for the signal magnetic fields Hs1 and Hs2. FIG. 3B is a characteristic diagram illustrating a relation between the inclination angle $\theta 1$ [°] indicated by a horizontal axis and an output variation [–] relative to a signal magnetic field indicated by a vertical axis. The output variation in the vertical axis is represented by a numerical value standardized with a maximum value set as 100.

Likewise, as illustrated in FIG. 2B, the magnetic field detection elements 2 and 4 each include a magneto-resistive effect film MR3 and a magneto-resistive effect film MR4 that are coupled in series. The magneto-resistive effect film MR3 has a major-axis direction J3 inclined at an inclination angle $\theta 3$ relative to the +X direction. The magneto-resistive effect film MR4 has a major-axis direction J4 inclined at an inclination angle $\theta 4$ relative to the +X direction. Although FIG. 2B exemplifies two magneto-resistive effect films MR3 and two magneto-resistive effect films MR4 arranged alternately along the Y-axis direction in the magnetic field detection elements 2 and 4, the disclosure is not limited thereto. That is, the magnetic field detection elements 2 and 4 may be each provided with one magneto-resistive effect film MR3 and one magneto-resistive effect film MR4, or may be each provided with three or more magneto-resistive effect films MR3 and three or more magneto-resistive effect films MR4. Further, for example, the number of the magneto-resistive effect films MR3 included in the magnetic field detection element 2 and the number of the magneto-resistive effect films MR4 included therein may be equal to or different from each other; provided that a difference between the number of the magneto-resistive effect films MR3 and the number of the magneto-resistive effect films MR4 may be within 20% or lower. In the magnetic field detection element 2, the sum of the number of the magneto-resistive effect films MR3 and the number of the magneto-resistive effect films MR4 may be an even number or an odd number. Accordingly, in the magnetic field detection element 2, for example, the number of the magneto-resistive effect films MR3 may be eight, while the number of the magneto-resistive effect films MR4 may be ten. In an alternative embodiment, the number of the magneto-resistive effect films MR3 may be nine, while the number of the magneto-resistive effect films MR4 may be eight. The similar to the magnetic field detection element 2 holds true also for the magnetic field detection element 4.

The magneto-resistive effect film MR3 is a specific but non-limiting example corresponding to the "first magneto-resistive effect film" in one embodiment of the disclosure. The magneto-resistive effect film MR4 is a specific but non-limiting example corresponding to the "second magneto-resistive effect film" in one embodiment of the disclosure.

Moreover, the magneto-resistive effect film MR3 and the magneto-resistive effect film MR4 in each of the magnetic field detection elements 2 and 4 satisfy the following conditional expressions (5) and (6):

$$0°<\theta 3<90° \tag{5}$$

$$-90°<\theta 4<0° \tag{6}$$

where $\theta 3$ denotes an inclination angle of the major-axis direction J3 relative to the +X direction, and $\theta 4$ denotes an inclination angle of the major-axis direction J4 relative to the +X direction In the conditional expressions (5) and (6) as well, the +X direction is set to 0°; an angle range clockwise from the +X direction toward the –X direction is represented by a positive numerical value, whereas an angle range counterclockwise from the +X direction toward the –X direction is represented by a negative numerical value.

In an example embodiment, the magneto-resistive effect film MR3 and the magneto-resistive effect film MR4 in each of the magnetic field detection elements 2 and 4 may further satisfy the following conditional expressions (7) and (8):

$$50°<\theta 3<72° \tag{7}$$

$$-72°<\theta 4<50° \tag{8}$$

In the conditional expressions (7) and (8) as well, the +X direction is set to 0°; an angle range clockwise from the +X direction toward the –X direction is represented by a positive numerical value, whereas an angle range counterclockwise from the +X direction toward the –X direction is represented by a negative numerical value.

Figure 5A:
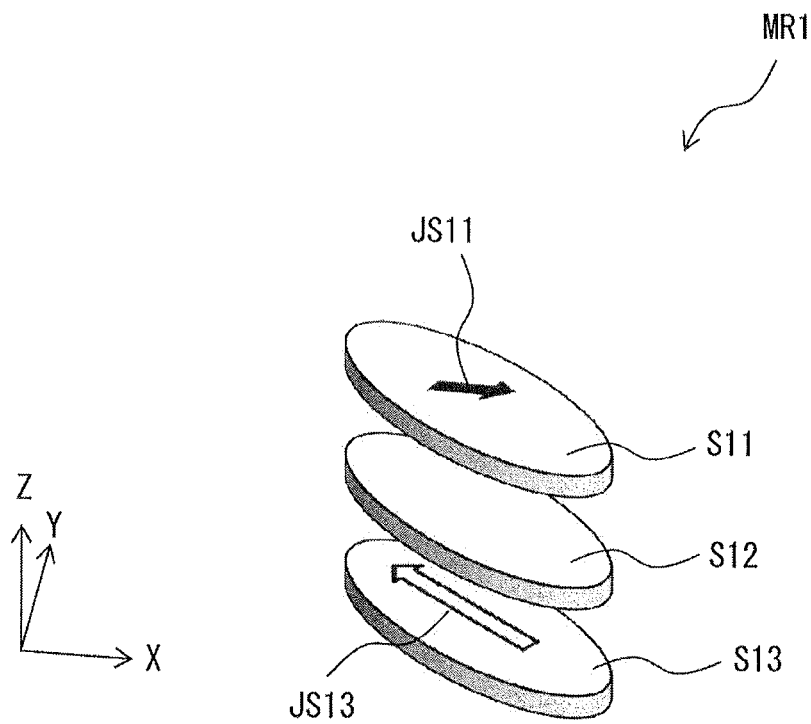
FIG. 5A is an exploded perspective view of a stacked structure of a first magneto-resistive effect film included in a first magnetic field detection element illustrated in FIG. 1.
Figure 5B:
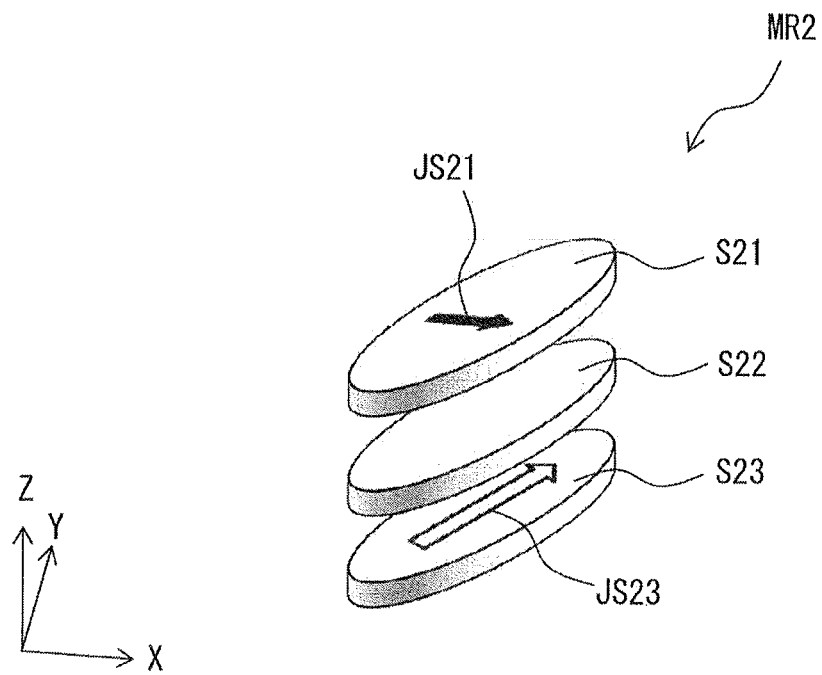
FIG. 5B is an exploded perspective view of a stacked structure of a second magneto-resistive effect film included in the first magnetic field detection element illustrated in FIG. 1.
Figure 5C:
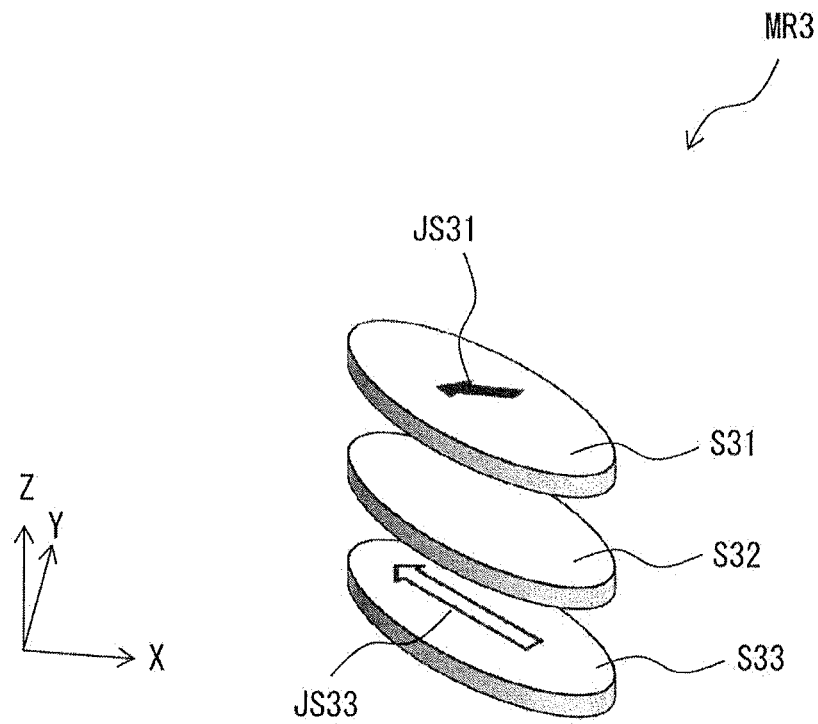
FIG. 5C is an exploded perspective view of a stacked structure of a third magneto-resistive effect film included in a second magnetic field detection element illustrated in FIG. 1.
Figure 5D:
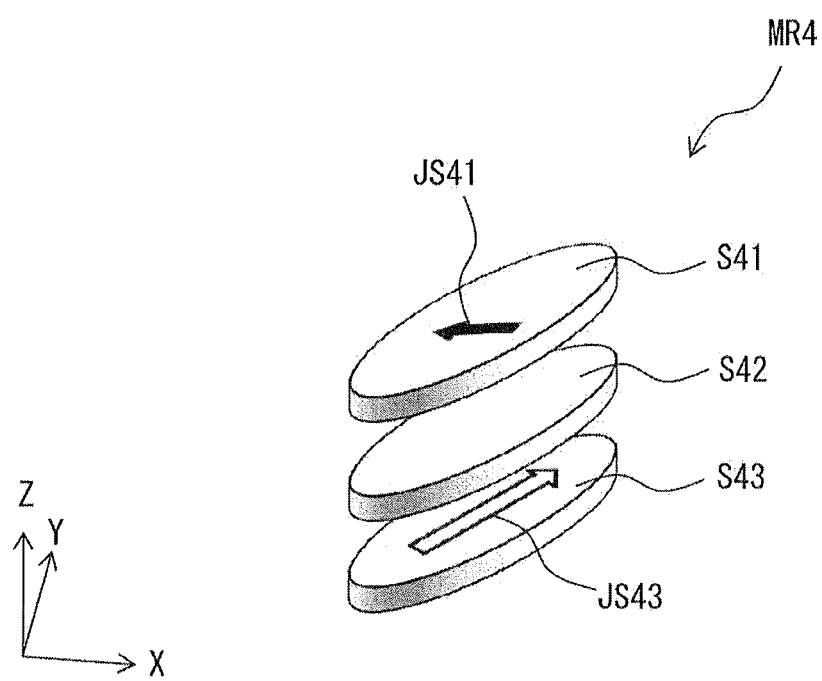
FIG. 5D is an exploded perspective view of a stacked structure of a fourth magneto-resistive effect film included in the second magnetic field detection element illustrated in FIG. 1.

FIG. 5A is an exploded perspective view of a stacked structure of the magneto-resistive effect film MR1 included in each of the magnetic field detection elements 1 and 3. FIG. 5B is an exploded perspective view of a stacked structure of the magneto-resistive effect film MR2 included in each of the magnetic field detection elements 1 and 3. FIG. 5C is an exploded perspective view of a stacked structure of the magneto-resistive effect film MR3 included in each of the magnetic field detection elements 2 and 4. FIG. 5D is an exploded perspective view of a stacked structure of the magneto-resistive effect film MR4 included in each of the magnetic field detection elements 2 and 4.

The magneto-resistive effect films MR1 to MR4 may each have a spin-valve structure in which a plurality of functional films including a magnetic layer are stacked, as illustrated in FIGS. 5A to 5D. In a specific but non-limiting example, as illustrated in FIG. 5A, the magneto-resistive effect film MR1 may have a configuration in which a magnetization pinned layer S11, an intermediate layer S12, and the magnetization free layer S13 are stacked in order in the Z-axis direction. The magnetization pinned layer S11 may have a magnetization JS11 pinned in the +X direction. The intermediate layer S12 may be a non-magnetic body. The magnetization free layer S13 may have the magnetization JS13 that varies depending on magnetic flux density of each of the signal magnetic fields Hs1 and Hs2. The magnetization pinned layer S11, the intermediate layer S12, and the magnetization free layer S13 may be each a thin film that extends in an X-Y plane. Accordingly, an orientation of the magnetization JS13 of the magnetization free layer S13 may be rotatable in the X-Y plane.

As illustrated in FIG. 5B, the magneto-resistive effect film MR2 may have a configuration in which a magnetization pinned layer S21, an intermediate layer S22, and a magnetization free layer S23 are stacked in order in the Z-axis direction. The magnetization pinned layer S21 may have a magnetization JS21 pinned in the +X direction. The intermediate layer S22 may be a non-magnetic body. The magnetization free layer S23 may have a magnetization JS23 that varies depending on the magnetic flux density of each of the signal magnetic fields Hs1 and Hs2. The magnetization pinned layer S21, the intermediate layer S22, and the magnetization free layer S23 may be each a thin film that extends in the X-Y plane. Accordingly, an orientation of the magnetization JS23 of the magnetization free layer S23 may be rotatable in the X-Y plane.

As illustrated in FIG. 5C, the magneto-resistive effect film MR3 may have a configuration in which a magnetization pinned layer S31, an intermediate layer S32, and a magnetization free layer S33 are stacked in order in the Z-axis direction. The magnetization pinned layer S31 may have a magnetization JS31 pinned in the −X direction. The intermediate layer S32 may be a non-magnetic body. The magnetization free layer S33 may have a magnetization JS33 that varies depending on the magnetic flux density of each of the signal magnetic fields Hs1 and Hs2. The magnetization pinned layer S31, the intermediate layer S32, and the magnetization free layer S33 may be each a thin film that extends in the X-Y plane. Accordingly, an orientation of the magnetization JS33 of the magnetization free layer S33 may be rotatable in the X-Y plane.

As illustrated in FIG. 5D, the magneto-resistive effect film MR4 may have a configuration in which a magnetization pinned layer S41, an intermediate layer S42, and a magnetization free layer S43 are stacked in order in the Z-axis direction. The magnetization pinned layer S41 may have a magnetization JS41 pinned in the −X direction. The intermediate layer S42 may be a non-magnetic body. The magnetization free layer S43 may have a magnetization JS43 that varies depending on the magnetic flux density of each of the signal magnetic fields Hs1 and Hs2. The magnetization pinned layer S41, the intermediate layer S42, and the magnetization free layer S43 may be each a thin film that extends in the X-Y plane. Accordingly, an orientation of the magnetization JS43 of the magnetization free layer S43 may be rotatable in the X-Y plane.

As described, the magnetization pinned layers S11 and S21 in the respective magneto-resistive effect films MR1 and MR2 may have the magnetizations JS11 and JS21, respectively, both pinned in the +X direction. Meanwhile, the magnetization pinned layers S31 and S41 in the respective magneto-resistive effect films MR3 and MR4 may have the magnetizations JS31 and JS41, respectively, both pinned in the −X direction.

The magnetizations JS11 and JS21 are each a specific but non-limiting example corresponding to a "first magnetization" in one embodiment of the disclosure. The magnetization pinned layers S11 and S21 are each a specific but non-limiting example corresponding to a "first magnetization pinned layer" in one embodiment of the disclosure. The magnetizations JS31 and JS41 are each a specific but non-limiting example corresponding to a "second magnetization" in one embodiment of the disclosure. The magnetization pinned layers S31 and S41 are each a specific but non-limiting example corresponding to a "second magnetization pinned layer" in one embodiment of the disclosure.

Figure 6A:
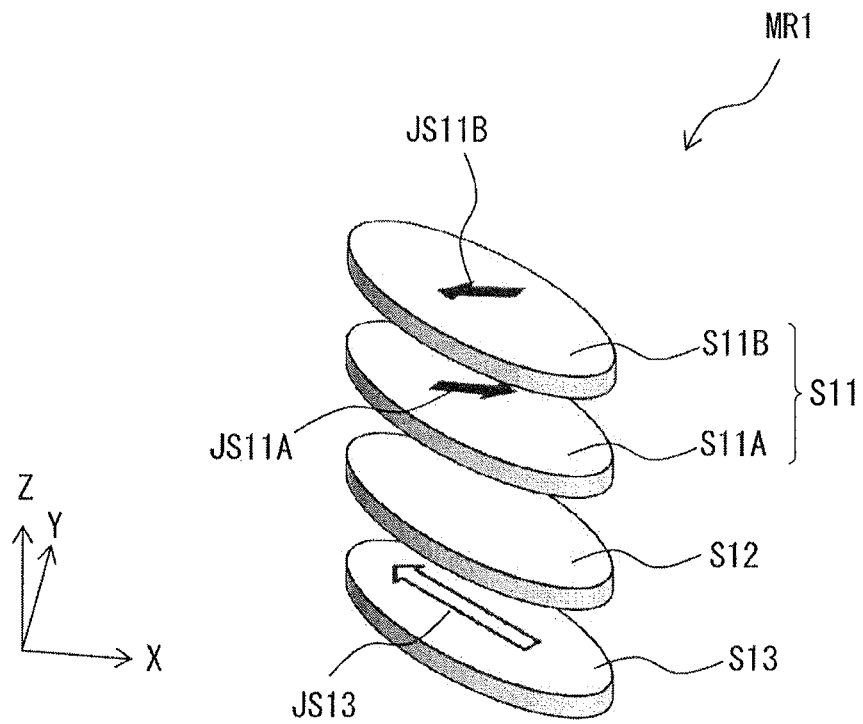
FIG. 6A is an exploded perspective view of another stacked structure of the first magneto-resistive effect film included in the first magnetic field detection element illustrated in FIG. 1.
Figure 6B:
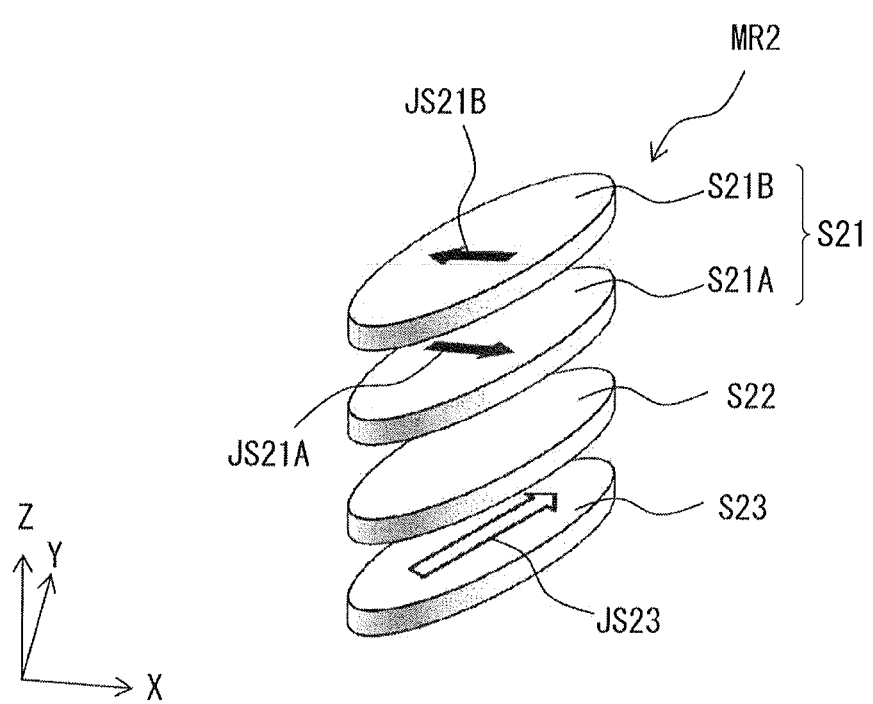
FIG. 6B is an exploded perspective view of another stacked structure of the second magneto-resistive effect film included in the first magnetic field detection element illustrated in FIG. 1.
Figure 6C:
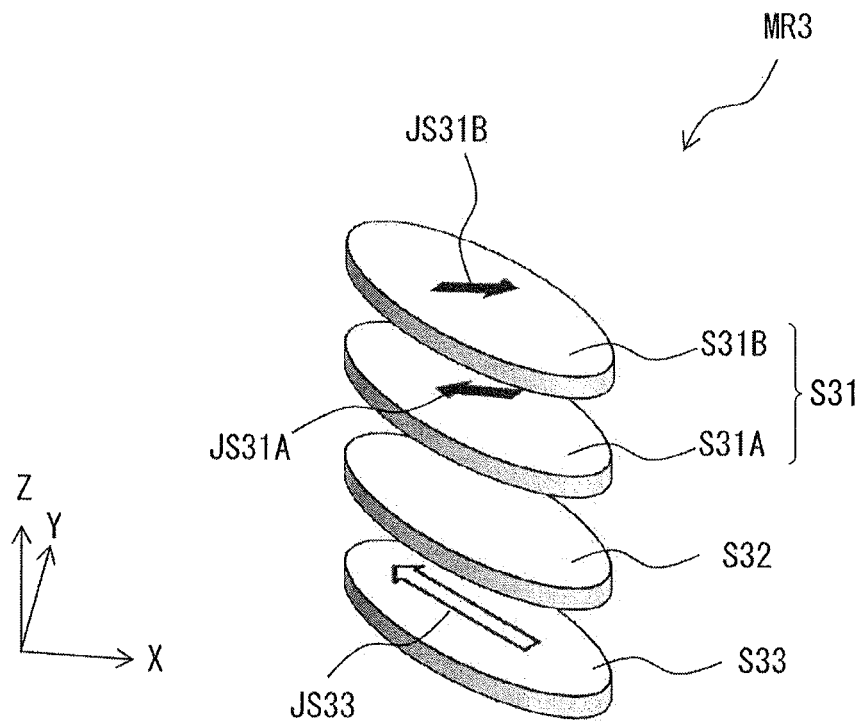
FIG. 6C is an exploded perspective view of another stacked structure of the third magneto-resistive effect film included in the second magnetic field detection element illustrated in FIG. 1.
Figure 6D:
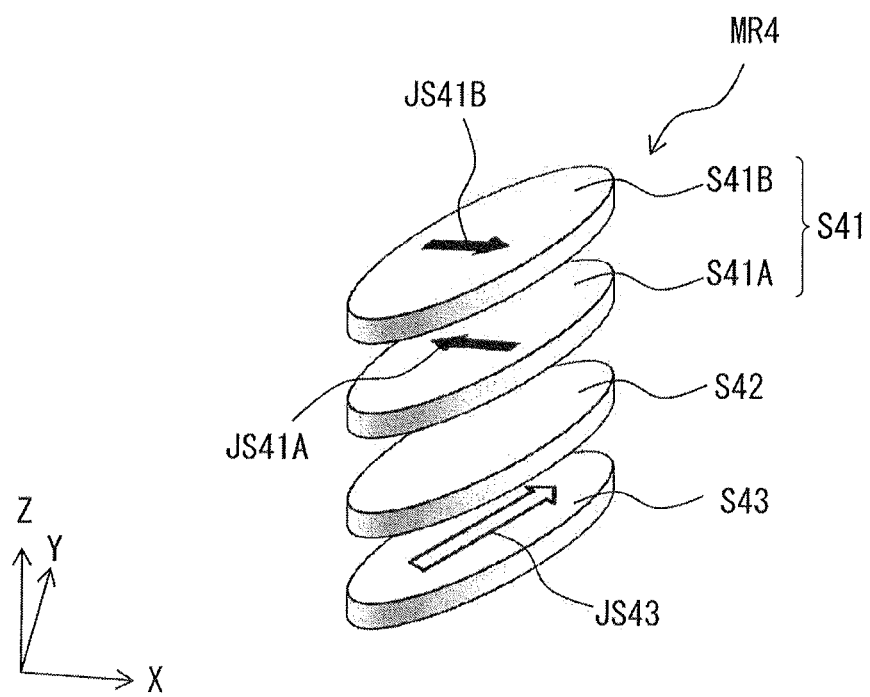
FIG. 6D is an exploded perspective view of another stacked structure of the fourth magneto-resistive effect film included in the second magnetic field detection element illustrated in FIG. 1.

In the magneto-resistive effect films MR1 to MR4, the magnetization pinned layers S11, S21, S31, and S41, the intermediate layers S12, S22, S32, and S42, and the magnetization free layers S13, S23, S33, and S43 may each have a single-layer structure or a multi-layer structure configured by a plurality of layers. For example, in the magneto-resistive effect films MR1 to MR4, the magnetization pinned layers S11, S21, S31, and S41 may each have a stacked ferrimagnetic structure, as illustrated in FIGS. 6A to 6D. In a specific but non-limiting example, as illustrated in FIG. 6A, the magnetization pinned layer S11 of the magneto-resistive effect film MR1 may have a two-layer structure including a magnetization pinned film S11A having a magnetization JS11A and a magnetization pinned film S11B having magnetization JS11B. An orientation of the magnetization JS11A and an orientation of the magnetization JS11B may be opposite to each other. In a specific but non-limiting example, the magnetization JS11A may be pinned in the +X direction, and the magnetization JS11B may be pinned in the −X direction. Likewise, as illustrated in FIG. 6B, the magnetization pinned layer S21 of the magneto-resistive effect film MR1 may have a two-layer structure including a magnetization pinned film S21A having a magnetization JS21A and a magnetization pinned film S21B having a magnetization JS21B. An orientation of the magnetization JS21A and an orientation of the magnetization JS21B may be opposite to each other. In a specific but non-limiting example, the magnetization JS21A may be pinned in the +X direction, and the magnetization JS21B may be pinned in the −X direction. As illustrated in FIG. 6C, the magnetization pinned layer S31 of the magneto-resistive effect film MR3 may have a two-layer structure including a magnetization pinned film S31A having a magnetization JS31A and a magnetization pinned film S31B having a magnetization JS31B. An orientation of the magnetization JS31A and an orientation of the magnetization JS31B may be opposite to each other. In a specific but non-limiting example, the magnetization JS31A may be pinned in the −X direction, and the magnetization JS31B may be pinned in the +X direction. As illustrated in FIG. 6D, the magnetization pinned layer S41 of the magneto-resistive effect film MR4 may have a two-layer structure including a magnetization pinned film S41A having a magnetization JS41A and a magnetization pinned film S41B having a magnetization JS41B. An orientation of the magnetization JS41A and an orientation of the magnetization JS41B may be opposite to each other. In a specific but non-limiting example, the magnetization JS41A may be pinned in the −X direction, and the magnetization JS41B may be pinned in the +X direction.

The magnetization pinned layers S11, S21, S31, and S41 may each include, for example, a ferromagnetic material such as cobalt (Co), a cobalt-iron alloy (CoFe), and a cobalt-iron-boron alloy (CoFeB). In the magneto-resistive effect films MR1 to MR4, unillustrated antiferromagnetic layers may be provided on sides opposite to the respective intermediate layers S12, S22, S32, and S42 to allow the antiferromagnetic layers to be adjacent to the respective magnetization pinned layers S11, S21, S31, and S41. Such antiferromagnetic layers may be each configured by an antiferromagnetic material such as a platinum-manganese alloy (PtMn) and an iridium-manganese alloy (IrMn). In the magneto-resistive effect films MR1 to MR4, the antiferromagnetic layers may be each in a state in which a spin magnetic moment in the +X direction and a spin magnetic moment in the −X direction completely cancel each other.

The antiferromagnetic layers may serve to fix orientations of the respective magnetizations JS11 and JS21 of the adjacent magnetization pinned layers S11 and S21 to the +X direction, or to fix orientations of the respective magnetizations JS31 and JS41 of the adjacent magnetization pinned layers S31 and S41 to the −X direction.

In a case where the spin valve structure serves as a magnetic tunnel junction (MTJ) film, the intermediate layers S12, S22, S32, and S42 may be each a non-magnetic tunnel barrier layer including magnesium oxide (MgO), for example, and may be each thin enough to enable a tunnel current based on quantum mechanics to pass therethrough. The tunnel barrier layer including MgO may be obtained by a process such as a process of oxidizing a thin film including magnesium (Mg) and a reactive sputtering process in which sputtering of magnesium is performed under an oxygen atmosphere, besides a sputtering process that uses a target including MgO, for example. It may also be possible to configure each of the intermediate layers S12, S22, S32, and S42 with use of an oxide or a nitride of each of aluminum (Al), tantalum (Ta), and hafnium (Hf), besides MgO. The intermediate layers S12, S22, S32, and S42 may be each configured by a platinum group element such as ruthenium (Ru), or a non-magnetic metal such as gold (Au) and copper (Cu), for example. In such a case, the spin valve structure may serve as a giant magneto-resistive effect (GMR) film.

The magnetization free layers S13, S23, S33, and S43 may be each a soft ferromagnetic layer, and may be formed by substantially the same material as each other. The magnetization free layers S13, S23, S33, and S43 may be each configured by, for example, a material such as a cobalt-iron alloy (CoFe), a nickel-iron alloy (NiFe), and a cobalt-iron-boron alloy (CoFeB).

[Bridge Circuit 7]

As illustrated in FIG. 4, four magnetic field detection elements 1 to 4 may be bridged to form a bridge circuit 7. The magnetic field detection elements 1 to 4 may be able to detect a variation in the signal magnetic field Hs1 or signal magnetic field Hs2 to be detected. As described above, the magnetic field detection elements 1 and 3 each have a resistance value that increases upon application of the signal magnetic field Hs1 in the +X direction and decreases upon application of the signal magnetic field Hs2 in the −X direction. Meanwhile, the magnetic field detection elements 2 and 4 each have a resistance value that decreases upon application of the signal magnetic field Hs1 in the +X direction and increases upon application of the signal magnetic field Hs2 in the −X direction. Accordingly, the magnetic field detection elements 1 and 3 and the magnetic field detection elements 2 and 4 may output respective signals depending on the variation in the signal magnetic field Hs1 or the signal magnetic field Hs2. Phases of the respective signals may be different from each other by 180°, for example.

As illustrated in FIG. 4, the bridge circuit 7 may have a configuration in which the magnetic field detection element 1 and the magnetic field detection element 2 coupled in series and the magnetic field detection element 3 and the magnetic field detection element 4 coupled in series are coupled in parallel to each other. In a more specific but non-limiting example, in the bridge circuit 7, one end of the magnetic field detection element 1 and one end of the magnetic field detection element 2 may be coupled at a node P1; one end of the magnetic field detection element 3 and one end of the magnetic field detection element 4 may be coupled at a node P2; the other end of the magnetic field detection element 1 and the other end of the magnetic field detection element 4 may be coupled at a node P3; and the other end of the magnetic field detection element 2 and the other end of the magnetic field detection element 3 may be coupled at a node P4. The node P3 may be coupled to a power supply terminal Vcc, and the node P4 may be coupled to a ground terminal GND. The node P1 may be coupled to an output terminal Vout1, and the node P2 may be coupled to an output terminal Vout2. Each of the output terminal Vout1 and the output terminal Vout2 may be coupled to an input-side terminal of a differential detector 8, for example. This differential detector 8 may detect a potential difference between the node P1 and the node P2 at a time when a voltage is applied between the node P3 and the node P4, and output the detected potential difference to an arithmetic circuit 9 as a differential signal S. The potential difference between the node P1 and the node P2 may be a difference between voltage drops that are respectively generated in the magnetic field detection element 1 and the magnetic field detection element 4.

In FIG. 4, an arrow with reference numerals JS11 and JS21 schematically indicates orientations of the magnetizations JS11 and JS21, illustrated respectively in FIGS. 5A and 5B, of the magnetization pinned layers S11 and S 21, illustrated respectively in FIGS. 5A and 5B, in each of the magnetic field detection elements 1 and 3. Further, in FIG. 4, an arrow with reference numerals JS31 and JS41 schematically indicates orientations of the magnetizations JS31 and JS41, illustrated respectively in FIGS. 5C and 5D, of the magnetization pinned layers S31 and S41, illustrated respectively in FIGS. 5C and 5D, in each of the magnetic field detection elements 2 and 4. As illustrated in FIG. 4, the orientation of the magnetizations JS11 and JS21 and the orientation of the magnetizations JS31 and JS41 may be opposite to each other. In other words, FIG. 4 illustrates that a resistance value of the magnetic field detection element 1 and a resistance value of the magnetic field detection element 3 vary, e.g., increase or decrease in the same orientation as each other depending on the variation in the signal magnetic field Hs1 or Hs2. FIG. 4 also illustrates that both a resistance value of the magnetic field detection element 2 and a resistance value of the magnetic field detection element 4 vary, i.e., decrease or increase in an orientation opposite to those of the variations in the respective resistance values of the magnetic field detection elements 1 and 3 depending on the variation in the signal magnetic field Hs1 or Hs2.

Current I10 from the power supply terminal Vcc may split into a current I1 and a current I2 at the node P3. The current I1 or the current I2 may be supplied to each of the magnetic field detection elements 1 to 4 constituting the bridge circuit 7. Signals e1 and e2 may respectively be extracted from the nodes P2 and P1 of the bridge circuit 7. The signals e1 and e2 may flow into the differential detector 8.

[Operations and Workings of Magnetic Field Detection Device 10]

In the magnetic field detection device 10 according to the present embodiment, it is possible to detect variations in the signal magnetic fields Hs1 and Hs2 generated, respectively, by the signal currents Is1 and Is2 flowing through the bus 5.

[Detecting Operation]

First, consider a state where neither the signal magnetic field Hs1 nor the signal magnetic field Hs2 is applied, in the magnetic field detection device 10. Here, r1 to r4 are set that denote respective resistance values of the magnetic field detection elements 1 to 4 at a time when the current I10 is flowed to the bridge circuit 7. The current I10 from the power supply terminal Vcc may split into two currents of the current I1 and the current I2 at the node P3. Thereafter, the current I1 having passed through the magnetic field detection element 1 and the magnetic field detection element 2 and the current I2 having passed through the magnetic field detection element 4 and the magnetic field detection element 3 may join at the node P4. In this case, a potential difference V between the node P3 and the node P4 may be represented as follows.

$$V=I1*r1+I1*r2=I2*r4+I2*r3=I1*(r1+r2)=I2*(r4+r3) \quad (9)$$

Further, a potential V1 at the node P1 and a potential V2 at the node P2 may be represented as follows.

$$V1=V-I1*r1$$

$$V2<V-I2*r4$$

Accordingly, a potential difference V0 between the node P1 and the node P2 is as follows.

$$V0=V2-V1=(V-I2*r4)-(V-I1*r1)=I1*r1-I2*r4 \quad (10)$$

Here, from the expression (9), the following expression holds true.

$$V0=r1/(r1+r2)\times V-r4/(r4+r3)\times V=\{r1/(r1+r2)-r4/(r4+r3)\}\times V \quad (11)$$

In the bridge circuit 7, the potential difference V0 between the node P2 and the node P1 represented by the above expression (11) may be measured when the signal magnetic fields Hs1 and Hs2 are applied, thereby allowing for obtainment of an amount of a resistance variation. Here, suppose that resistance values R1 to R4 of the respective magnetic field detection elements 1 to 4 vary by respective variation amounts ΔR1 to ΔR4 when the signal magnetic fields Hs1 and Hs2 are applied, i.e., suppose that the resistance values R1 to R4 after application of the signal magnetic fields Hs1 and Hs2 satisfy the following expressions.

$$R1=r1+\Delta R1$$

$$R2=r2+\Delta R2$$

$$R3=r3+\Delta R3$$

$$R4=r4+\Delta R4$$

In that case, from the expression (11), the potential difference V0 upon the application of the signal magnetic fields Hs1 and Hs2 is as follows.

$$V0=\{(r1+\Delta R1)/(r1+\Delta R1+r2+\Delta R2)-(r4+\Delta R4)/(r4+\Delta R4+r3+\Delta R3)\}\times V \quad (12)$$

The magnetic field detection device 10 may have a configuration in which the respective resistance values R1 and R3 of the magnetic field detection elements 1 and 3 and the respective resistance values R2 and R4 of the magnetic field detection elements 2 and 4 exhibit variations in directions opposite to each other. Accordingly, it follows that the variation amount ΔR4 and the variation amount ΔR1 cancel each other and that the variation amount ΔR3 and the variation amount ΔR2 cancel each other. Hence, in a case where comparison is made between before and after the application of the signal magnetic fields Hs1 and Hs2, there is substantially no increase in denominators of respective terms of the expression (12). Meanwhile, in numerators of the respective terms, it follows that an increase or a decrease appears because of the variation amount ΔR1 and the variation amount ΔR4 always having opposite signs.

Suppose that all of the magnetic field detection elements 1 to 4 have exactly the same characteristics, i.e., suppose that r1=r2=r3=r4 and ΔR1=−ΔR2=ΔR3=−ΔR4=ΔR hold true, the expression (12) is as follows.

$$V0=\{(R+\Delta R)/(2\times R)-(R-\Delta R)/(2\times R)\}\times V=(\Delta R/R)\times V$$

As described, by using the magnetic field detection elements 1 to 4 that are known in terms of characteristic values such as ΔR/R, it becomes possible to measure magnitude of the signal magnetic fields Hs1 and Hs2 and thus to estimate magnitude of the signal currents Is1 and Is2 that generate, respectively, the signal magnetic fields Hs1 and Hs2.

[Set-Reset Operation]

In a magnetic field detection device of this kind, magnetizations of magnetization free layers in each of magnetic field detection elements may be once aligned in a predetermined direction before performing a detecting operation of a signal magnetic field, in an example embodiment. One reason for this is to perform more accurate detecting operation of a signal magnetic field. In a specific but non-limiting example, an external magnetic field having known magnitude may be applied alternately in a predetermined direction and in a direction opposite thereto. This operation is referred to as a set-reset operation of a magnetization of a magnetization free layer.

Figure 7A:
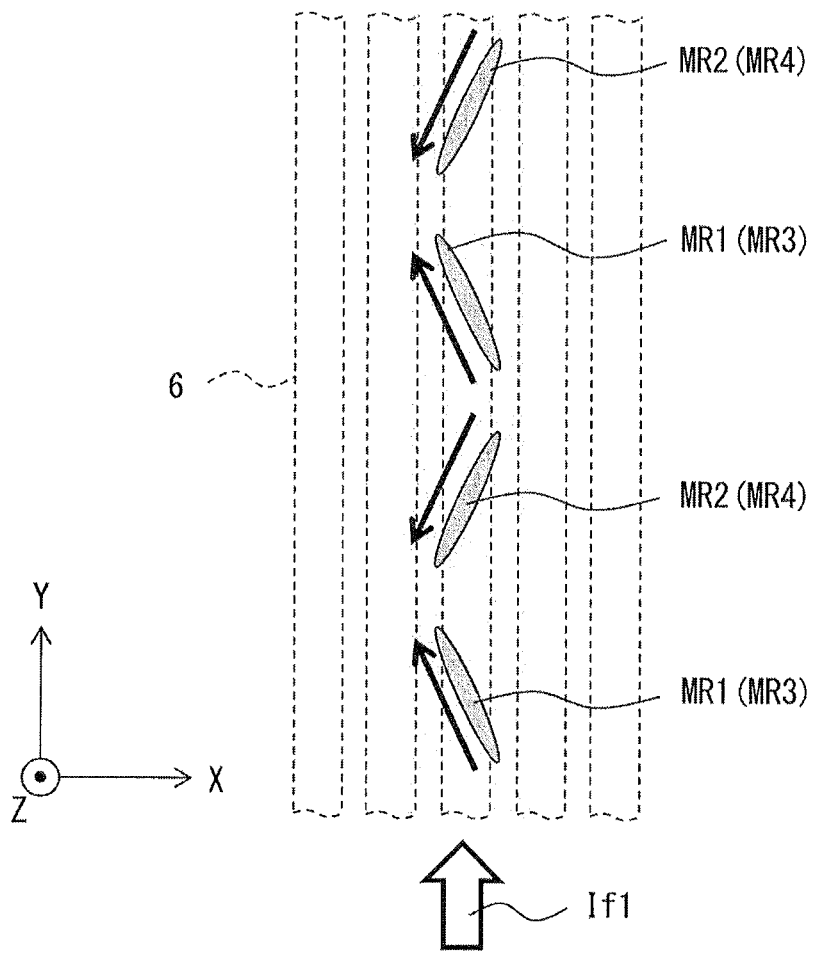
FIG. 7A is a schematic plan view of a set operation in the magnetic field detection device illustrated in FIG. 1.
Figure 7B:
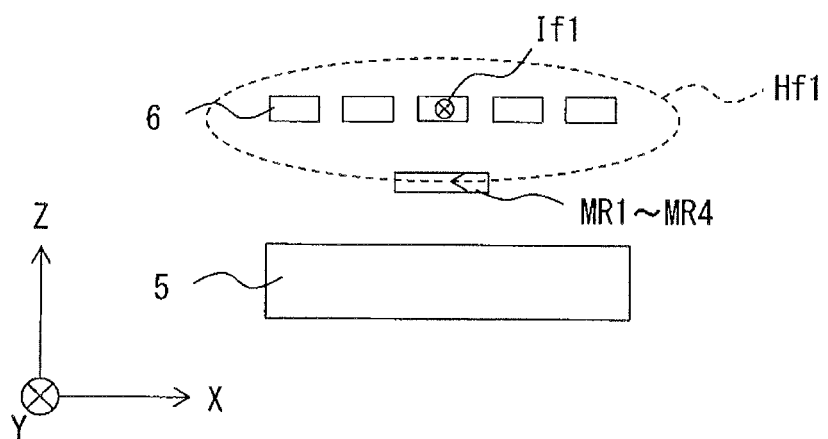
FIG. 7B is a schematic cross-sectional view of the set operation in the magnetic field detection device illustrated in FIG. 1.
Figure 8A:
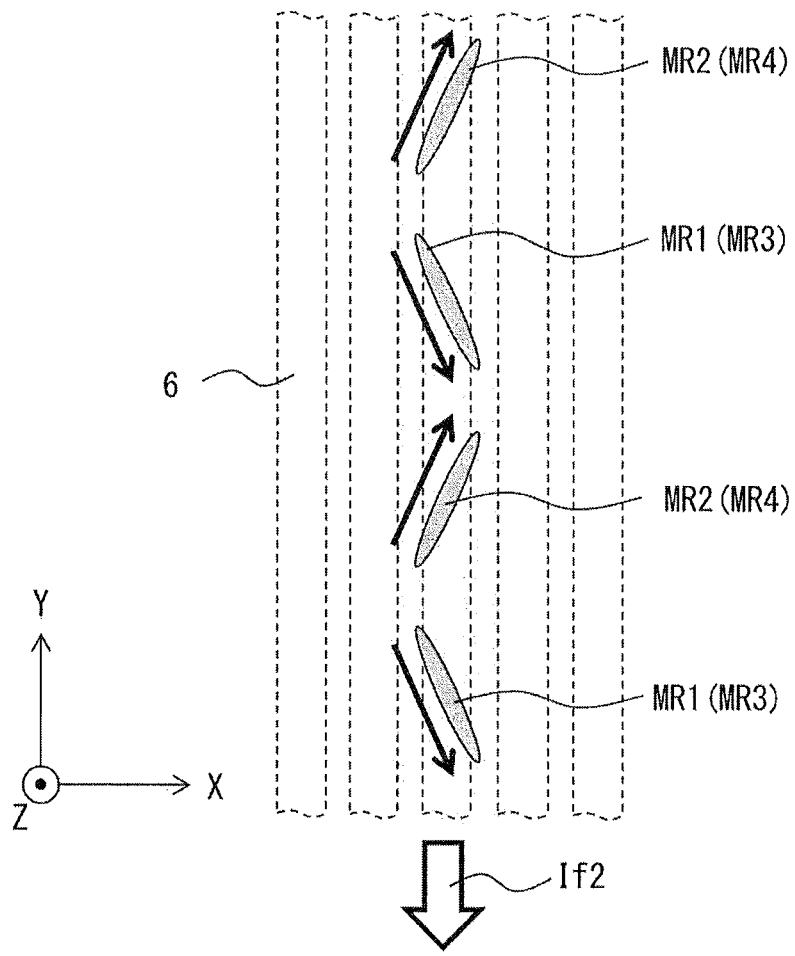
FIG. 8A is a schematic plan view of a reset operation in the magnetic field detection device illustrated in FIG. 1.
Figure 8B:
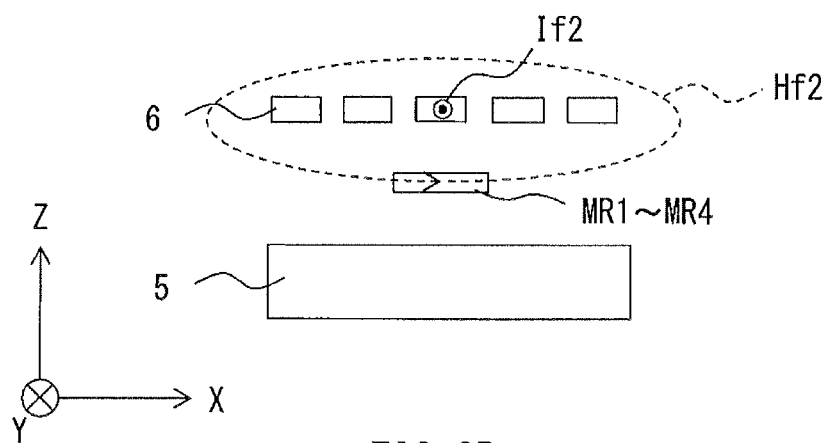
FIG. 8B is a schematic cross-sectional view of the reset operation in the magnetic field detection device illustrated in FIG. 1.

In the magnetic field detection device 10 of the present example embodiment, for example, the feedback current If1 in the +Y direction may be supplied to each of the plurality of feedback wiring lines 6 to perform the set operation, as illustrated in FIGS. 7A and 7B. The supply of the feedback current If1 in the +Y direction enables the feedback magnetic field Hf1 in the −X direction to be applied to the magneto-resistive effect films MR1 to MR4 of each of the magnetic field detection elements 1 to 4, as illustrated in FIG. 7B. This causes the magnetization free layers S13, S23, S33, and S43 of the respective magneto-resistive effect films MR1 to MR4 to be oriented in respective arrow directions indicated in FIG. 7A, thus performing the set operation. Meanwhile, for example, the feedback current If2 in the −Y direction may be supplied to each of the plurality of feedback wiring lines 6 to perform the reset operation, as illustrated in FIGS. 8A and 8B. The supply of the feedback current If2 in the −Y direction enables the feedback magnetic field Hf2 in the +X direction to be applied to the magneto-resistive effect films MR1 to MR4 of each of the magnetic field detection elements 1 to 4, as illustrated in FIG. 8B. This causes the magnetization free layers S13, S23, S33, and S43 of the respective magneto-resistive effect films MR1 to MR4 to be oriented in respective arrow directions indicated in FIG. 8A, thus performing the reset operation.

It is originally desirable, at an ordinary temperature, for example, to set an output from each of the magnetic field detection elements to zero when an external magnetic field is zero. Actually, however, a slight output may occur from each of the magnetic field detection elements even when the external magnetic field is zero, due to history of a magnetization in the magnetization free layer. The slight output is referred to as an offset value. For example, external factors may cause reversal of the orientation of the magnetization of the magnetization free layer in some cases, resulting in occurrence of variation in the offset value in some cases. Non-limiting examples of the external factors may include humidity, heat, variation in stress, and a disturbance magnetic field in a major-axis direction to be imparted to the magneto-resistive effect films MR1 to MR. The set operation and the reset operation on the magnetization free layer may be each a method that makes it possible to return an offset value, having been varied unintentionally due to the above-mentioned external factors, to an original offset value effectively and with high reproducibility. An absolute value of the offset value after the set operation and an absolute value of the offset value after the reset operation may be each as small as possible, in an example embodiment.

In this respect, it is possible for the magnetic field detection device 10 of the present example embodiment to sufficiently reduce a gap between the offset value after the set operation and the offset value after the reset operation. Reasons for this are that the magnetic field detection elements 1 and 3 may each include the magneto-resistive effect film MR1 and the magneto-resistive effect film MR2 and that the magnetic field detection elements 2 and 4 may each include the magneto-resistive effect film MR3 and the magneto-resistive effect film MR4. The magneto-resistive effect film MR1 may have the major-axis direction J1 that forms the inclination angle θ1 relative to the signal magnetic fields Hs1 and Hs2. The magneto-resistive effect film MR2 may have the major-axis direction J2 that forms the inclination angle θ2 relative to the signal magnetic fields Hs1 and Hs2. The magneto-resistive effect film MR3 may have the major-axis direction J3 that forms the inclination angle θ3 relative to the signal magnetic fields Hs1 and Hs2. The magneto-resistive effect film MR4 may have the major-axis direction J4 that forms the inclination angle θ4 relative to the signal magnetic fields Hs1 and Hs2.

[Effects of Magnetic Field Detection Device 10]

As described, the magnetic field detection device 10 of the present example embodiment makes it possible to exhibit high detection accuracy.

[Experimental Examples]

Description is given next of a working example of the disclosure.

[Working Example]

Figure 9A:
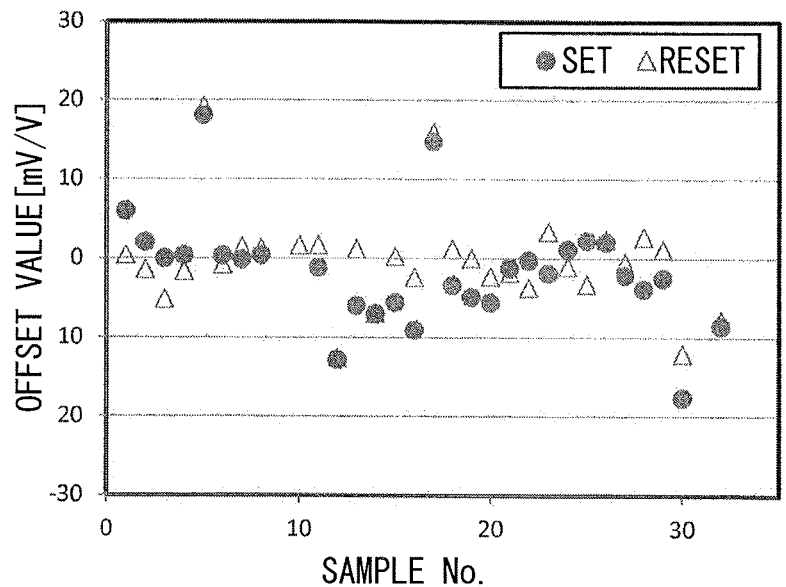
FIG. 9A is a characteristic diagram illustrating dispersion of offset current values in a magnetic field detection device according to a working example.

Thirty-two samples were prepared for the magnetic field detection device 10 illustrated in figures such as FIG. 1. For each of the samples, an offset value after the set operation described with reference to FIGS. 7A and 7B and an offset value after the reset operation described with reference to FIGS. 8A and 8B were measured. The results of the measurement are illustrated in FIG. 9A. In FIG. 9A, the horizontal axis indicates a sample number, and the vertical axis indicates an offset value. The offset value after the set operation is indicated by a legend ●, and the offset value after the reset operation is indicated by a legend Δ.

[Reference Example]

Figure 9B:
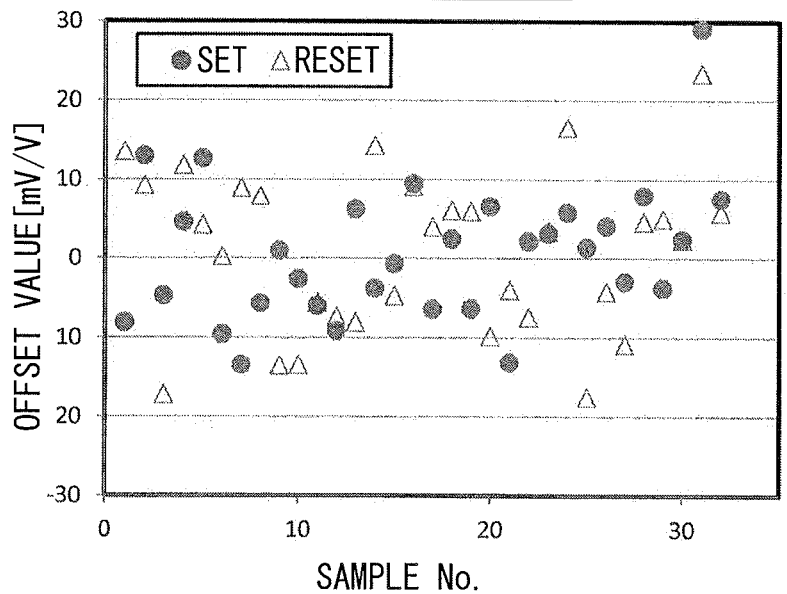
FIG. 9B is a characteristic diagram illustrating dispersion of offset current values in a magnetic field detection device according to a reference example.
Figure 13:
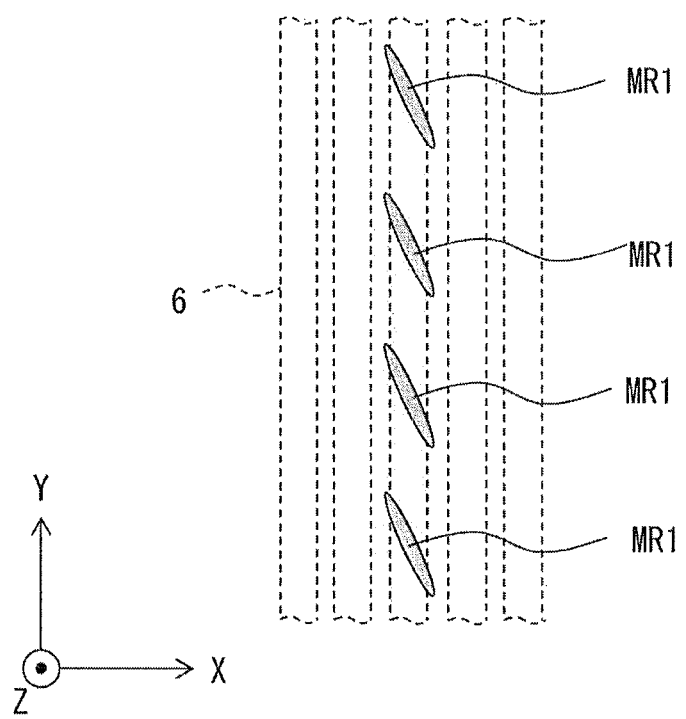
FIG. 13 is a plan view of a configuration of a main part of the magnetic field detection device according to the reference example.

As a reference example to be used for comparison with the magnetic field detection device 10, thirty-two samples were prepared for a magnetic field detection device provided with only a magnetic field detection element including a plurality of magneto-resistive effect films MR1, as illustrated in FIG. 13, having respective major-axis directions inclined in the same direction relative to the signal magnetic fields Hs1 and Hs2. For each of the samples, an offset value after the set operation and an offset value after the reset operation were measured. The results of the measurement are illustrated in FIG. 9B. In FIG. 9B, the horizontal axis indicates a sample number, and the vertical axis indicates an offset value. The offset value after the set operation is indicated by a legend ●, and the offset value after the reset operation is indicated by a legend Δ.

It was confirmed, from comparison between FIGS. 9A and 9B, that dispersion of offset values is obviously smaller in the working example illustrated in FIG. 9A than in the reference example illustrated in FIG. 9B, both after the set operation and after the reset operation.

[2. Modification Examples]

The disclosure has been described hereinabove referring to some embodiments. However, the disclosure is not limited to such embodiments, and may be modified in a variety of ways. For example, in the foregoing embodiments, the four magnetic field detection elements are used as a sensor section to form a full-bridge circuit. However, in one embodiment of the disclosure, for example, two magnetic field detection elements may be used to form a half-bridge circuit. Further, a shape and a dimension of the plurality of magneto-resistive effect films may be the same as one another, or may be different from one another. Dimensions of respective components and layouts of the respective components are merely illustrative, and are not limited thereto.

Figure 10A:
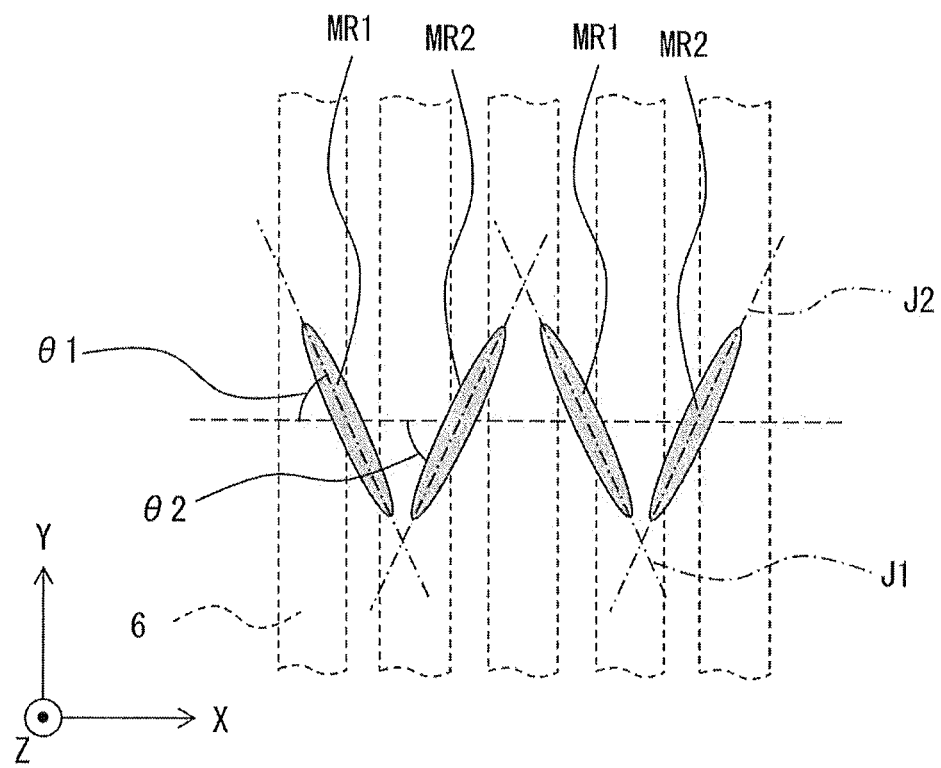
FIG. 10A is a plan view of a configuration of a main part of a magnetic field detection device according to a first modification example of the disclosure.
Figure 10B:
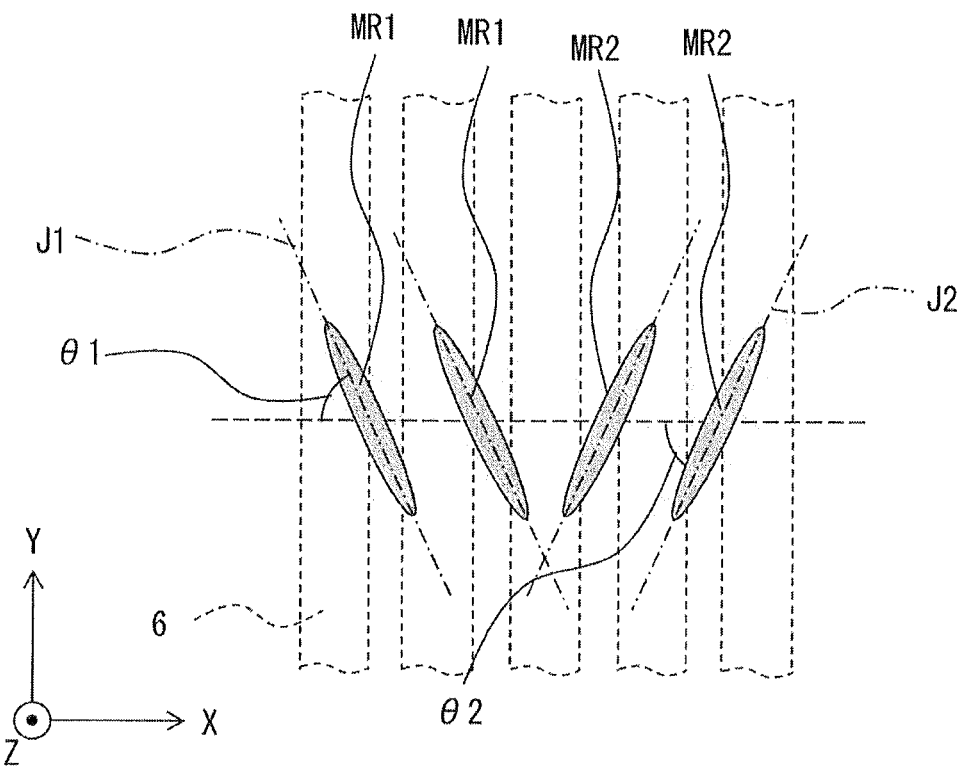
FIG. 10B is a plan view of a configuration of a main part of a magnetic field detection device according to a second modification example of the disclosure.

The foregoing example embodiment exemplifies the case where the plurality of magneto-resistive effect films in each of the magnetic field detection elements 1 to 4 are arranged along the Y-axis direction that is an extending direction of the bus 5 and the feedback wiring lines 6. However, the disclosure is not limited thereto. For example, as in a first modification example illustrated in FIG. 10A or in a second modification example illustrated in FIG. 10B, the plurality of magneto-resistive effect films may be arranged along the X-axis direction to be parallel to the signal magnetic fields Hs1 and Hs2.

Figure 11:
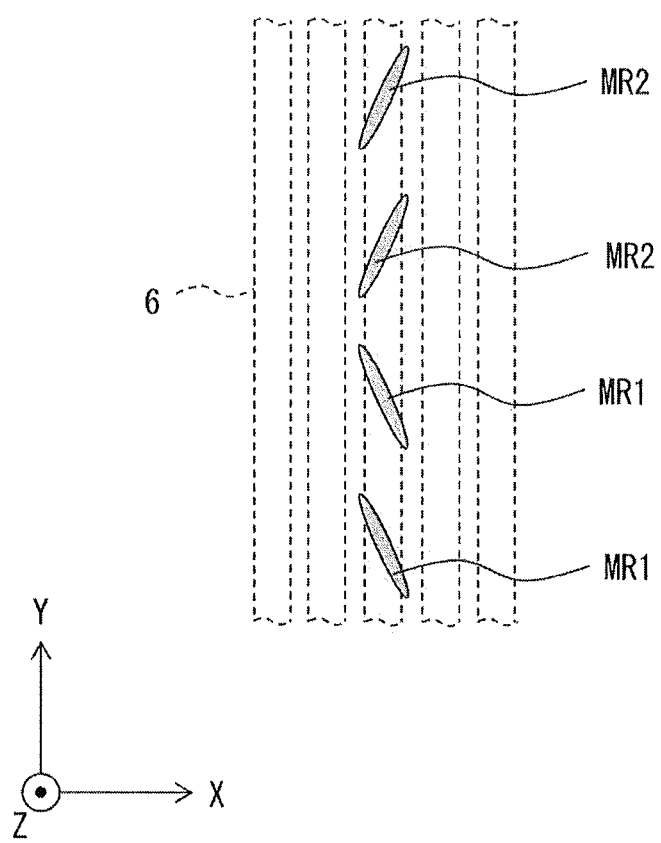
FIG. 11 is a plan view of a configuration of a main part of a magnetic field detection device according to a third modification example of the disclosure.

The foregoing example embodiment exemplifies the case where the magneto-resistive effect film MR1 (MR3) and the magneto-resistive effect film MR2 (MR4) are arranged alternately in each of the magnetic field detection elements 1 to 4. However, the disclosure is not limited thereto. For example, as in a third modification example illustrated in FIG. 11, the plurality of magneto-resistive effect films inclined in the same orientation may be arranged to be adjacent to each other.

Figure 12A:
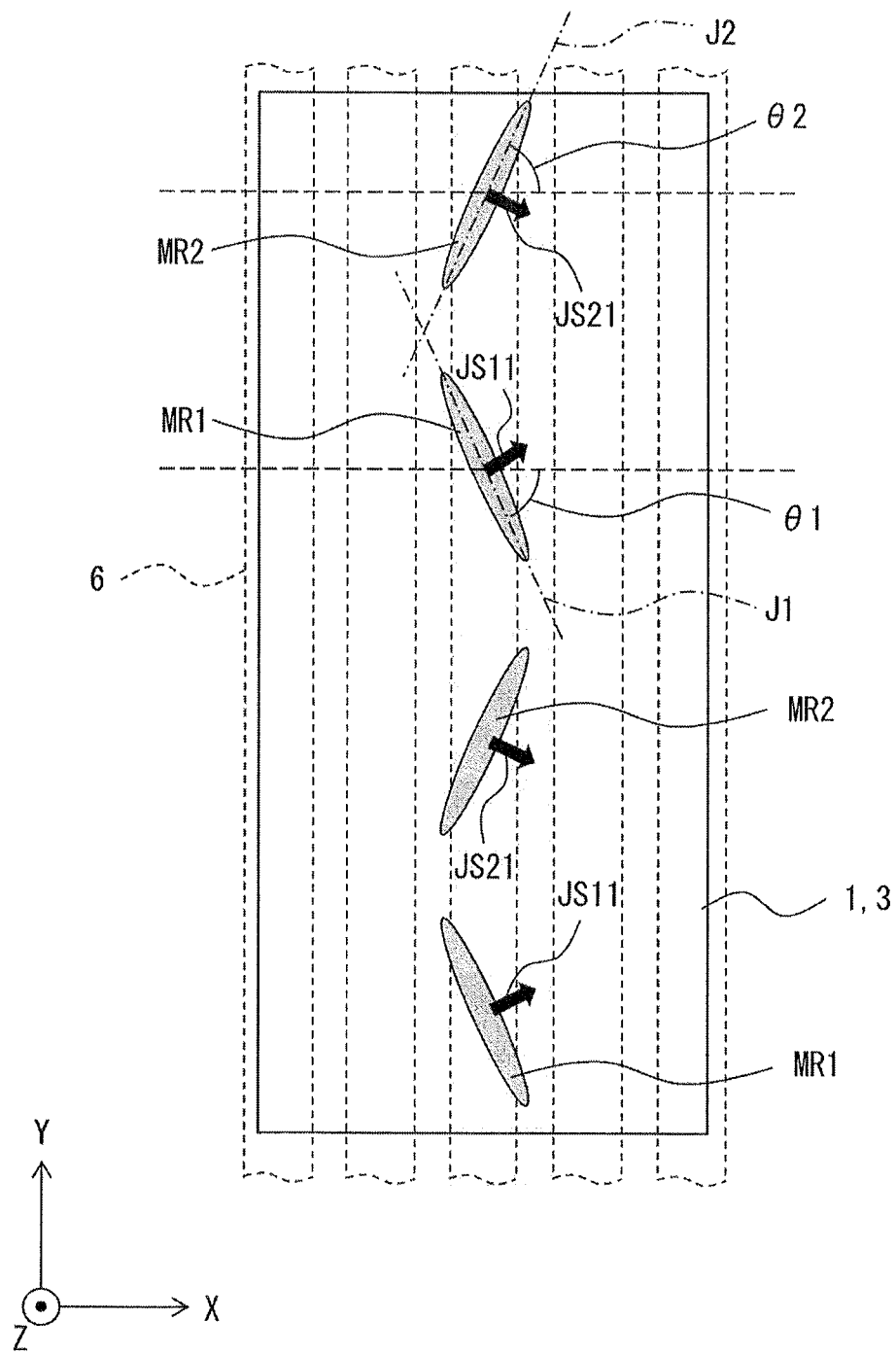
FIG. 12A is a plan view of a configuration of a main part of a magnetic field detection device according to a fourth modification example of the disclosure.
Figure 12B:
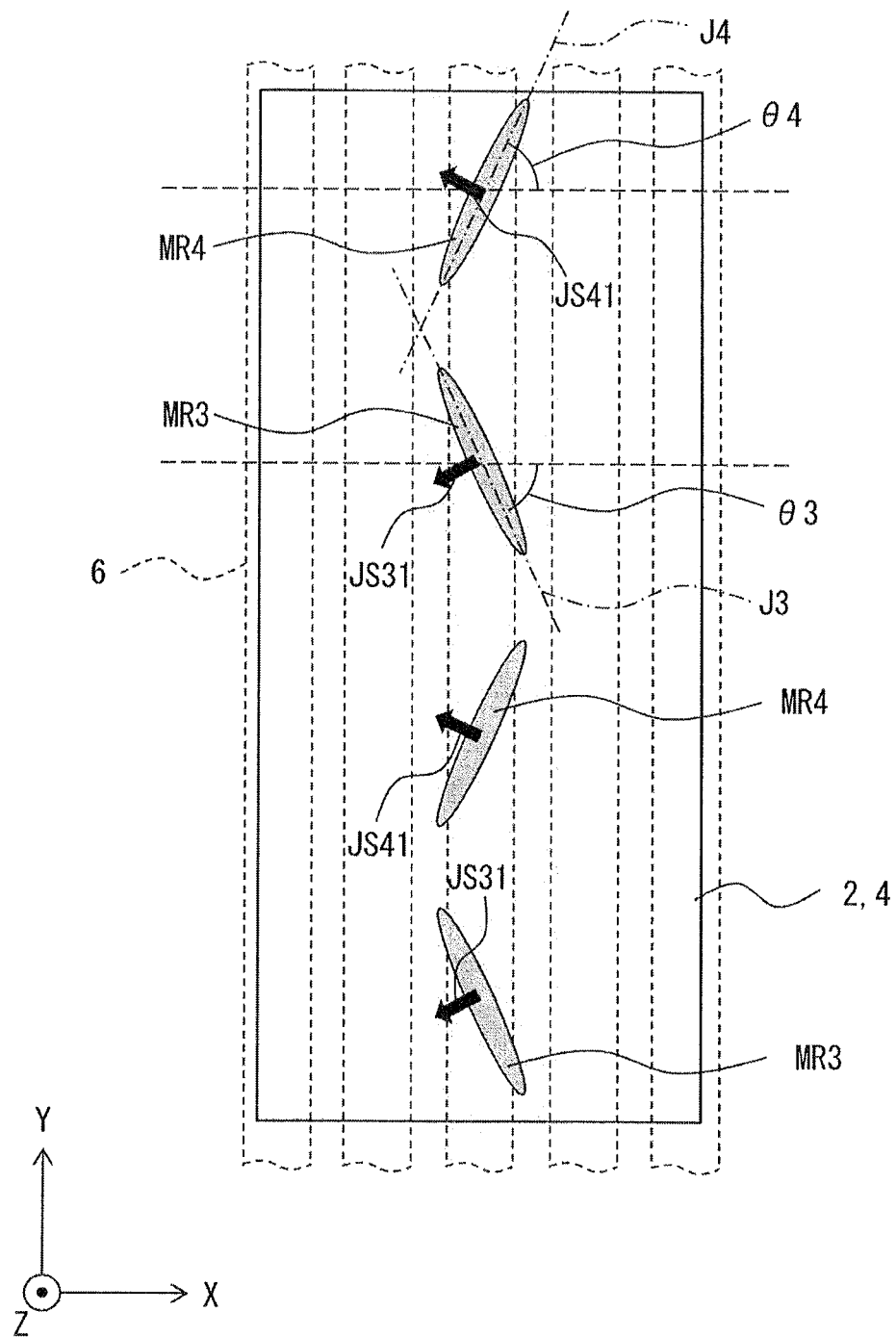
FIG. 12B is a plan view of another configuration of the main part of the magnetic field detection device according to the fourth modification example of the disclosure.

In the foregoing example embodiment, each of the orientations of the magnetizations JS11 and JS21 of the respective magnetization pinned layers S11 and S21 is set in the +X direction, and each of the orientations of the magnetizations JS31 and JS41 of the respective magnetization pinned layers S31 and S41 is set in the −X direction. However, the disclosure is not limited thereto. For example, as in a fourth modification example illustrated in FIGS. 12A and 12B, the orientations of the magnetizations JS11, JS21, JS31, and JS41 may be set in directions orthogonal, respectively, to the major-axis directions J1 to J4 of the magneto-resistive effect films MR1 to MR4.

The description has been given, in the foregoing example embodiment, of the case where the bus 5 as the first conductor and the feedback wiring lines 6 as the second conductor extend in parallel to each other. However, the disclosure is not limited thereto. For example, the second conductor may be slightly inclined relative to the first conductor. In this case, it is sufficient that a feedback current flowing through the second conductor may generate a feedback magnetic field including a component in an orientation opposite to a signal magnetic field generated by a signal current flowing through the first conductor.

The description has been given, in the foregoing example embodiment, of the magnetic field detection device to be used as a current sensor that detects variation in a signal current flowing through a conductor. However, the application of the magnetic field detection device of an embodiment of the disclosure is not limited thereto. The magnetic field detection device of an embodiment of the disclosure is also applicable, for example, to a magnetic field detection device to be used as an angle detection sensor for use in detection of a rotation angle of a rotor, or to an electromagnetic compass that detects geomagnetism.

Moreover, the disclosure encompasses any possible combination of some or all of the various embodiments and the modification examples described herein and incorporated herein.

It is possible to achieve at least the following configurations from the above-described example embodiments of the disclosure.

(1)

A magnetic field detection device including:

a first magnetic field detection element having a first resistance value that increases upon application of a first magnetic field in a first direction and decreases upon application of a second magnetic field in a second direction opposite to the first direction; and a second magnetic field detection element having a second resistance value that decreases upon the application of the first magnetic field and increases upon the application of the second magnetic field, the first magnetic field detection element and the second magnetic field detection element each including a first magneto-resistive effect film and a second magneto-resistive effect film that are coupled in series, the first magneto-resistive effect film having a first major-axis direction inclined at a first inclination angle relative to the first direction, the second magneto-resistive effect film having a second major-axis direction inclined at a second inclination angle relative to the first direction, the following conditional expressions (1) and (2) being satisfied:

$$0° < \theta 1 < 90° \quad (1)$$

$$-90° < \theta 2 < 0° \quad (2)$$

where

θ1 denotes the first inclination angle of the first major-axis direction relative to the first direction, and θ2 denotes the second inclination angle of the second major-axis direction relative to the first direction.

(2)

The magnetic field detection device according to (1), in which the following conditional expressions (3) and (4) are satisfied:

$$50° < \theta 1 < 72° \quad (3)$$

$$-72° < \theta 2 < -50° \quad (4).$$

(3)

The magnetic field detection device according to (1) or (2), in which the first magneto-resistive effect film includes a first magnetization pinned layer having a magnetization pinned in a first pinning direction substantially orthogonal to the first major-axis direction, and the second magneto-resistive effect film includes a second magnetization pinned layer having a magnetization pinned in a second pinning direction substantially orthogonal to the second major-axis direction.

(4)

The magnetic field detection device according to (1) or (2), in which the first magneto-resistive effect film includes a first magnetization pinned layer having a first magnetization pinned in the first direction, and the second magneto-resistive effect film includes a second magnetization pinned layer having a second magnetization pinned in the second direction.

(5)

The magnetic field detection device according to any one of (1) to (4), further including a first conductor configured to generate the first magnetic field by a first signal current and to generate the second magnetic field by a second signal current, the first signal current flowing in a first current direction orthogonal to both of the first direction and the second direction, the second signal current flowing in a second current direction opposite to the first current direction.

(6)

The magnetic field detection device according to any one of (1) to (4), further including a second conductor disposed to face both of the first magnetic field detection element and the second magnetic field detection element while being electrically insulated from both of the first magnetic field detection element and the second magnetic field detection element, in which the second conductor is configured to generate a first feedback magnetic field in an orientation opposite to the first magnetic field by being supplied with a first feedback current, the first feedback magnetic field including a component to be imparted to both of the first magnetic field detection element and the second magnetic field detection element, and the second conductor is configured to generate a second feedback magnetic field in an orientation opposite to the second magnetic field by being supplied with a second feedback current, the second feedback magnetic field including a component to be imparted to both of the first magnetic field detection element and the second magnetic field detection element.

(7)

The magnetic field detection device according to any one of (1) to (6), in which the first magneto-resistive effect film includes a plurality of first magneto-resistive effect films, the second magneto-resistive effect film includes a plurality of second magneto-resistive effect films, the first magnetic field detection element and the second magnetic field detection element each include the plurality of first magneto-resistive effect films and the plurality of second magneto-resistive effect films, the plurality of first magneto-resistive effect films are substantially equal in the first inclination angle of the first major-axis direction, and the plurality of second magneto-resistive effect films are substantially equal in the second inclination angle of the second major-axis direction.

According to the magnetic field detection device of one embodiment of the disclosure, it is possible to exhibit high detection accuracy.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A magnetic field detection device comprising:
a first magnetic field detection element having a first resistance value that increases upon application of a first magnetic field in a first direction and decreases upon application of a second magnetic field in a second direction opposite to the first direction; and
a second magnetic field detection element having a second resistance value that decreases upon the application of the first magnetic field and increases upon the application of the second magnetic field,
the first magnetic field detection element and the second magnetic field detection element each including a first magneto-resistive effect film and a second magneto-resistive effect film that are coupled in series, the first magneto-resistive effect film having a first major-axis direction inclined at a first inclination angle relative to the first direction, the second magneto-resistive effect film having a second major-axis direction inclined at a second inclination angle relative to the first direction,
the following conditional expressions (1) and (2) being satisfied:

$$0° < \theta1 < 90° \quad (1)$$

$$-90° < \theta2 < 0° \quad (2)$$

where
θ1 denotes the first inclination angle of the first major-axis direction relative to the first direction, and
θ2 denotes the second inclination angle of the second major-axis direction relative to the first direction.

2. The magnetic field detection device according to claim 1, wherein the following conditional expressions (3) and (4) are satisfied:

$$50° < \theta1 < 72° \quad (3)$$

$$-72° < \theta2 < -50° \quad (4).$$

3. The magnetic field detection device according to claim 1, wherein
the first magneto-resistive effect film includes a first magnetization pinned layer having a magnetization pinned in a first pinning direction substantially orthogonal to the first major-axis direction, and
the second magneto-resistive effect film includes a second magnetization pinned layer having a magnetization pinned in a second pinning direction substantially orthogonal to the second major-axis direction.

4. The magnetic field detection device according to claim 1, wherein
the first magneto-resistive effect film and the second magneto-resistive effect film in the first magnetic field detection element each include a first magnetization pinned layer having a first magnetization pinned in the first direction, and
the first magneto-resistive effect film and the second magneto-resistive effect film in the second magnetic field detection element each include a second magnetization pinned layer having a second magnetization pinned in the second direction.

5. The magnetic field detection device according to claim 1, further comprising a first conductor configured to generate the first magnetic field by a first signal current and to generate the second magnetic field by a second signal current, the first signal current flowing in a first current direction orthogonal to both of the first direction and the second direction, the second signal current flowing in a second current direction opposite to the first current direction.

6. The magnetic field detection device according to claim 1, further comprising a second conductor disposed to face both of the first magnetic field detection element and the second magnetic field detection element while being electrically insulated from both of the first magnetic field detection element and the second magnetic field detection element, wherein
the second conductor is configured to generate a first feedback magnetic field in an orientation opposite to the first magnetic field by being supplied with a first feedback current, the first feedback magnetic field including a component to be imparted to both of the first magnetic field detection element and the second magnetic field detection element, and
the second conductor is configured to generate a second feedback magnetic field in an orientation opposite to the second magnetic field by being supplied with a second feedback current, the second feedback magnetic field including a component to be imparted to both of the first magnetic field detection element and the second magnetic field detection element.

7. The magnetic field detection device according to claim 1, wherein
the first magneto-resistive effect film comprises a plurality of first magneto-resistive effect films,
the second magneto-resistive effect film comprises a plurality of second magneto-resistive effect films,
the first magnetic field detection element and the second magnetic field detection element each include the plurality of first magneto-resistive effect films and the plurality of second magneto-resistive effect films,
the plurality of first magneto-resistive effect films are substantially equal in the first inclination angle of the first major-axis direction, and
the plurality of second magneto-resistive effect films are substantially equal in the second inclination angle of the second major-axis direction.

* * * * *